United States Patent
Harmon et al.

(10) Patent No.: US 8,967,859 B2
(45) Date of Patent: Mar. 3, 2015

(54) MICROBOLOMETER AND PIXEL EXPLOITING AVALANCHE BREAKDOWN

(76) Inventors: Eric S. Harmon, Norfolk, MA (US); David B. Salzman, Chevy Chase, MD (US); James T. Hyland, Madison, CT (US)

(*) Notice: Subject to any disclaimer, the term of this patent is extended or adjusted under 35 U.S.C. 154(b) by 32 days.

(21) Appl. No.: 12/764,088

(22) Filed: Apr. 20, 2010

(65) Prior Publication Data

US 2013/0022077 A1   Jan. 24, 2013

Related U.S. Application Data

(60) Provisional application No. 61/283,700, filed on Dec. 8, 2009, provisional application No. 61/214,128, filed on Apr. 20, 2009.

(51) Int. Cl.
| | |
|---|---|
| G01K 7/00 | (2006.01) |
| G01J 5/00 | (2006.01) |
| G01J 5/20 | (2006.01) |
| H04N 5/33 | (2006.01) |
| H01L 27/146 | (2006.01) |
| G01J 5/02 | (2006.01) |
| G01J 5/24 | (2006.01) |

(52) U.S. Cl.
CPC ... G01J 5/20 (2013.01); H04N 5/33 (2013.01); H01L 27/14649 (2013.01); G01J 5/024 (2013.01); G01J 5/24 (2013.01)

USPC .......................................... 374/178; 250/338.1

(58) Field of Classification Search
USPC ........................................................... 250/338
See application file for complete search history.

(56) References Cited

U.S. PATENT DOCUMENTS

| | | | | |
|---|---|---|---|---|
| 5,965,892 | A  * | 10/1999 | Tanaka ..................... | 250/370.08 |
| 6,359,276 | B1 * | 3/2002 | Tu .............................. | 250/338.1 |
| 6,903,341 | B2 * | 6/2005 | Imai et al. ..................... | 250/340 |
| 7,026,617 | B2 * | 4/2006 | Mashio et al. ............. | 250/338.1 |
| 2006/0145190 | A1 * | 7/2006 | Salzman et al. .............. | 257/192 |
| 2006/0175529 | A1 * | 8/2006 | Harmon et al. ............... | 250/207 |
| 2007/0158638 | A1 * | 7/2007 | Perera et al. ..................... | 257/13 |

OTHER PUBLICATIONS

Sang J., Hwang H., Ho H., Hyan S., Man S., "A New CMOS Read-out IC for Uncooled Microbolometer Infrared Image Sensor", International Journal Infrared Milli Waves, 2008, vol. 29, pp. 953-965.*

* cited by examiner

Primary Examiner — Lisa Caputo
Assistant Examiner — Nasir U Ahmed

(57) ABSTRACT

A novel detector apparatus and detection method for measuring temperature exploit the avalanche transition edge, and are useful for contact and remote sensing & imaging and microbolometry of thermal, THz, LWIR/MWIR/SWIR/NIR, and visible light. The invention allows uncooled operation at kHz frame rates.

29 Claims, 29 Drawing Sheets

Preferred Embodiment

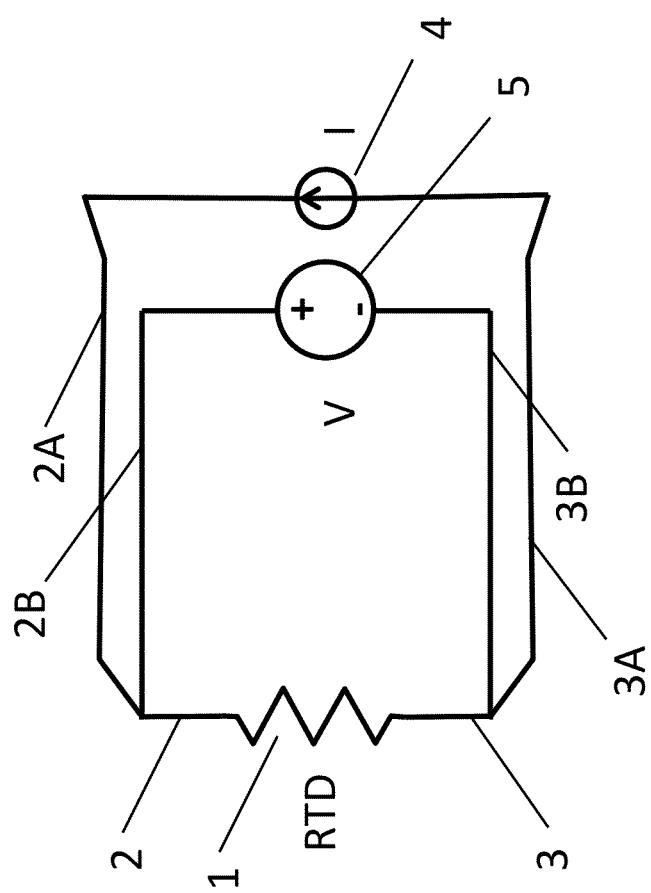
Figure 1A: Prior Art

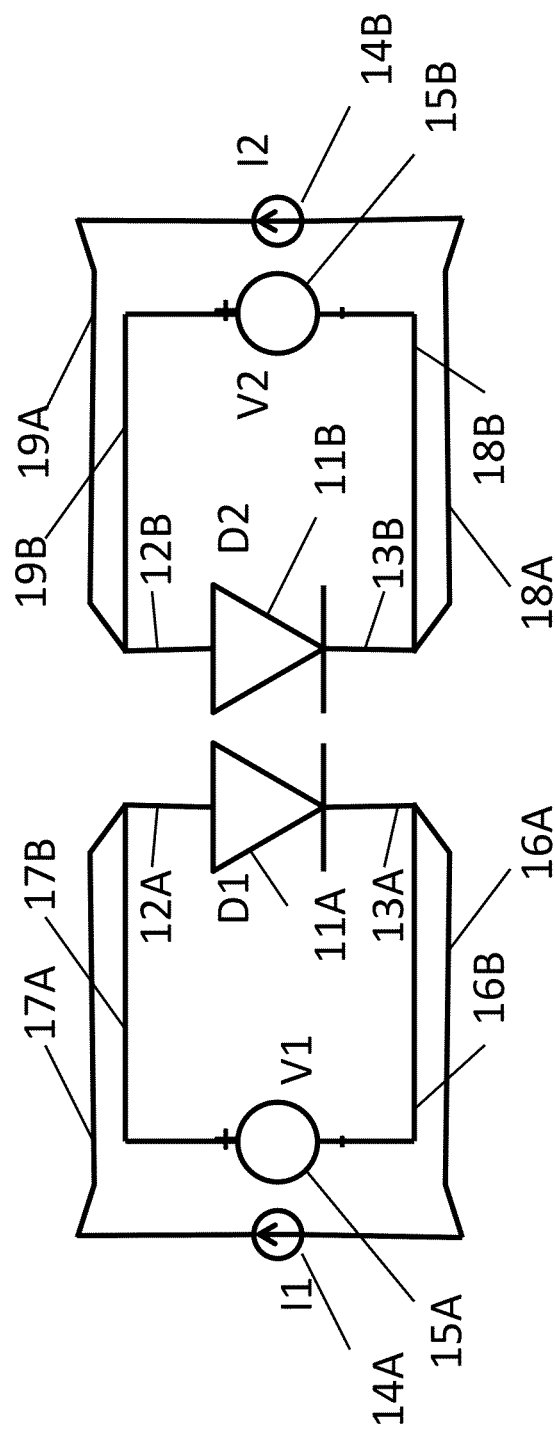
Figure 1B: Prior Art

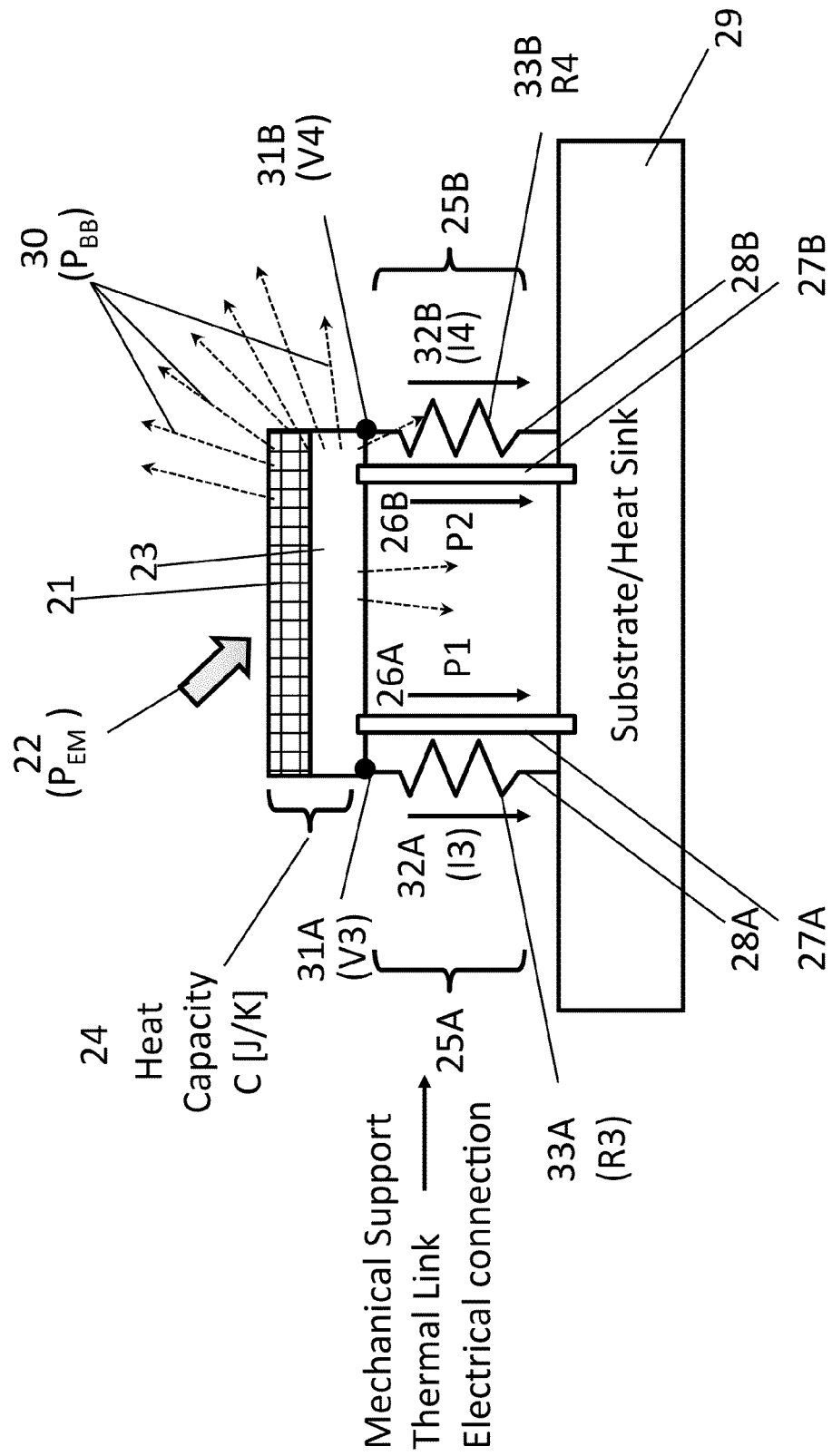
Figure 2: Prior Art

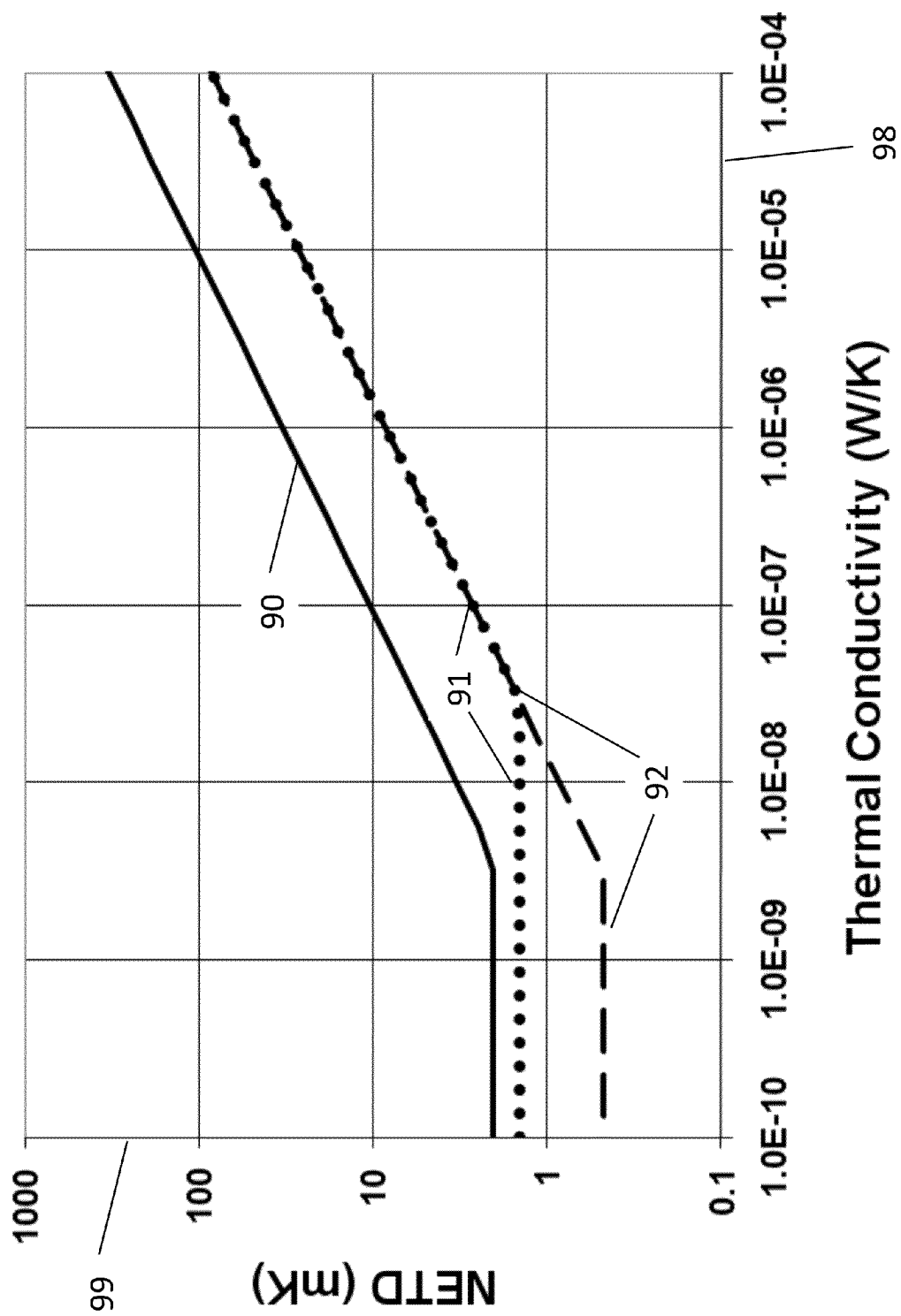
Figure 3: Prior Art

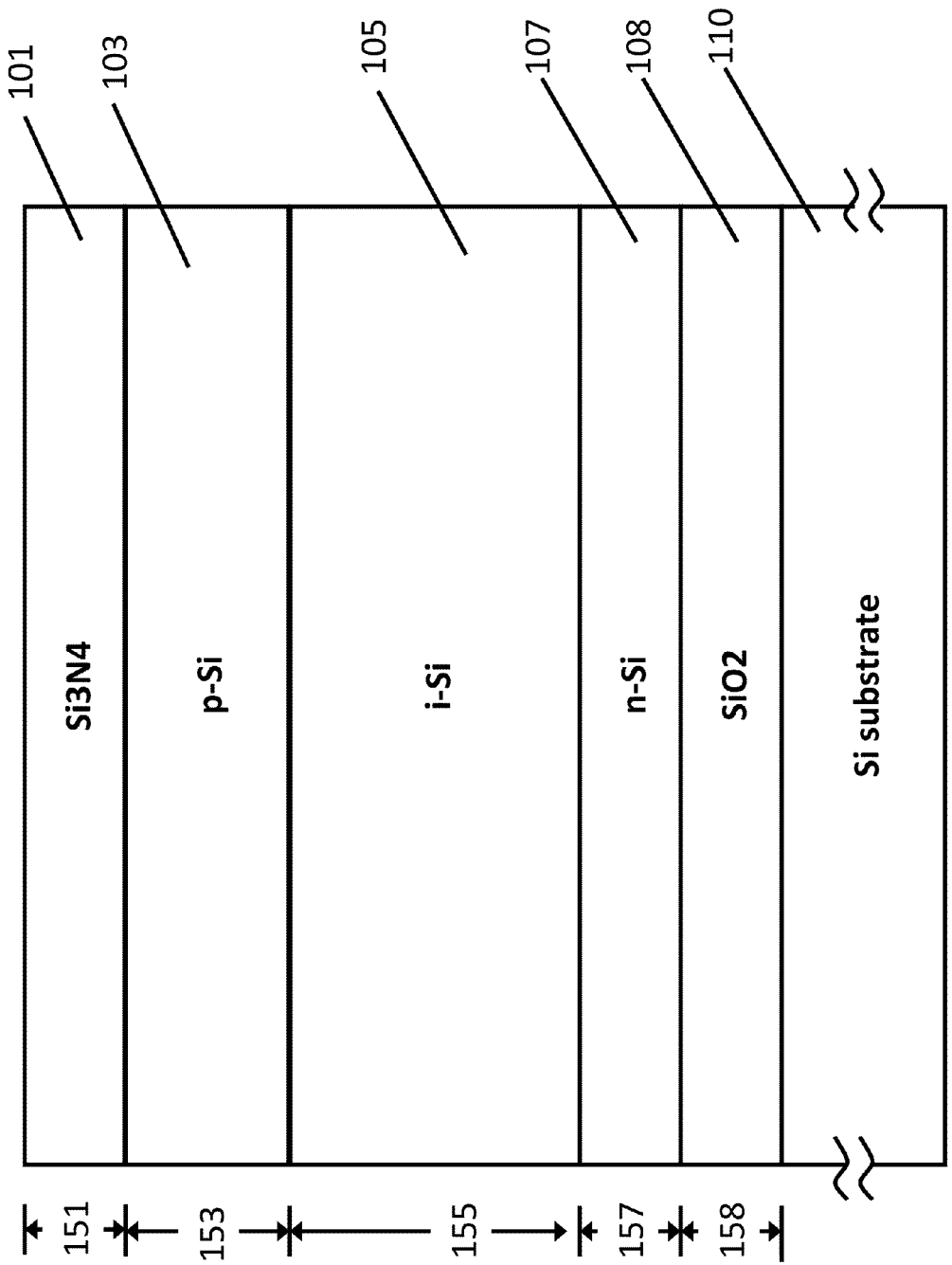
Figure 4A: Preferred Embodiment

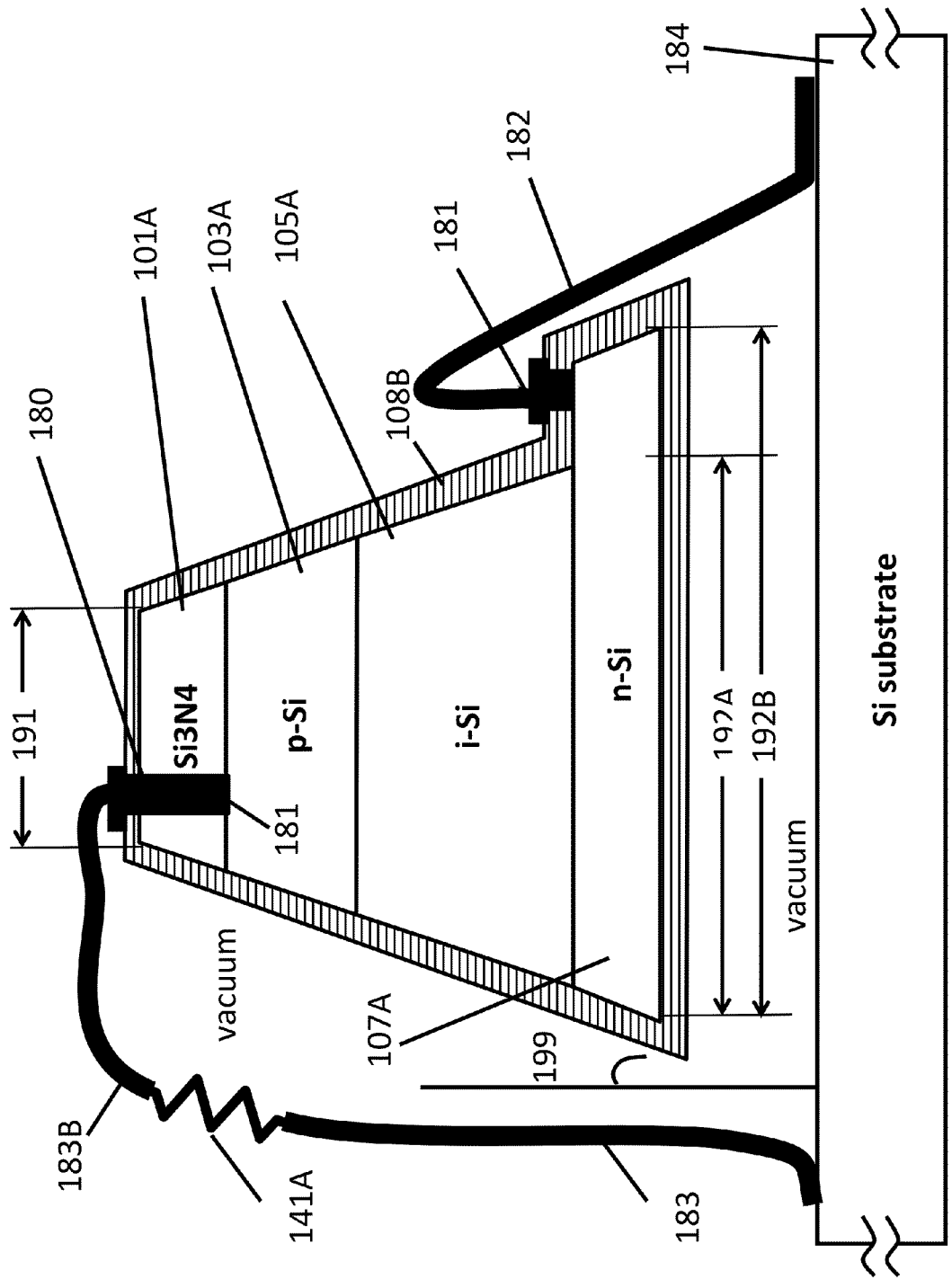
Figure 4B: Preferred Embodiment

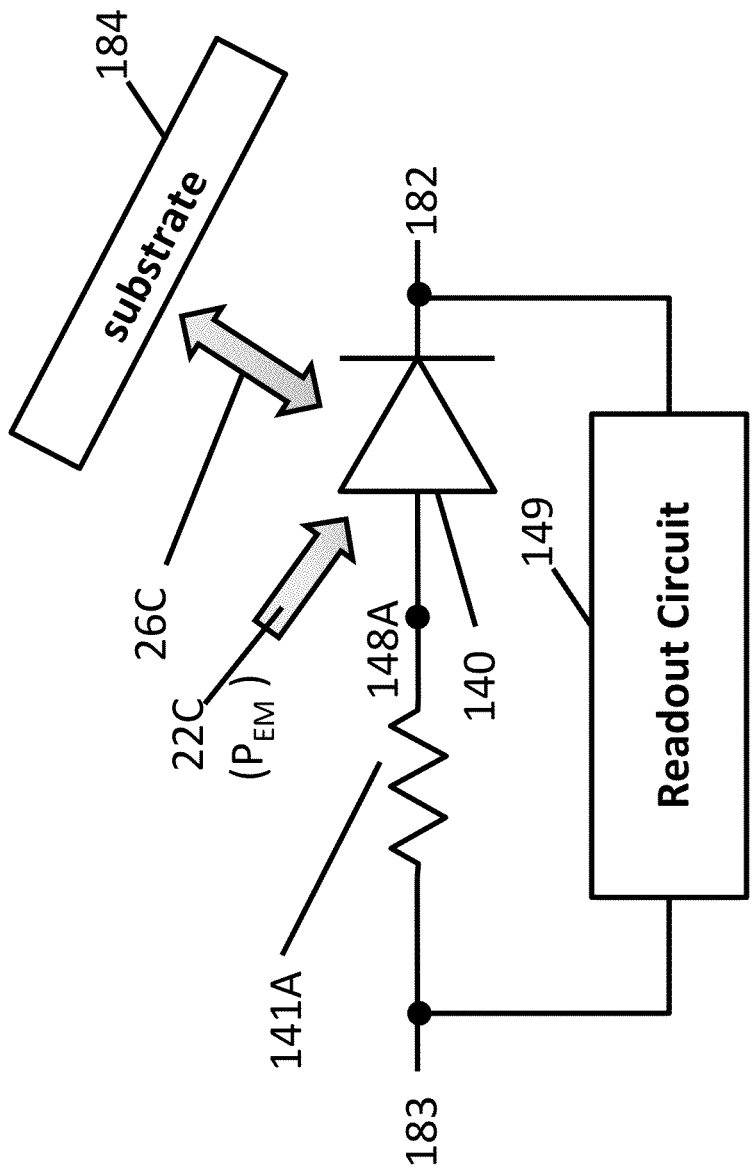
Figure 4C: Preferred Embodiment

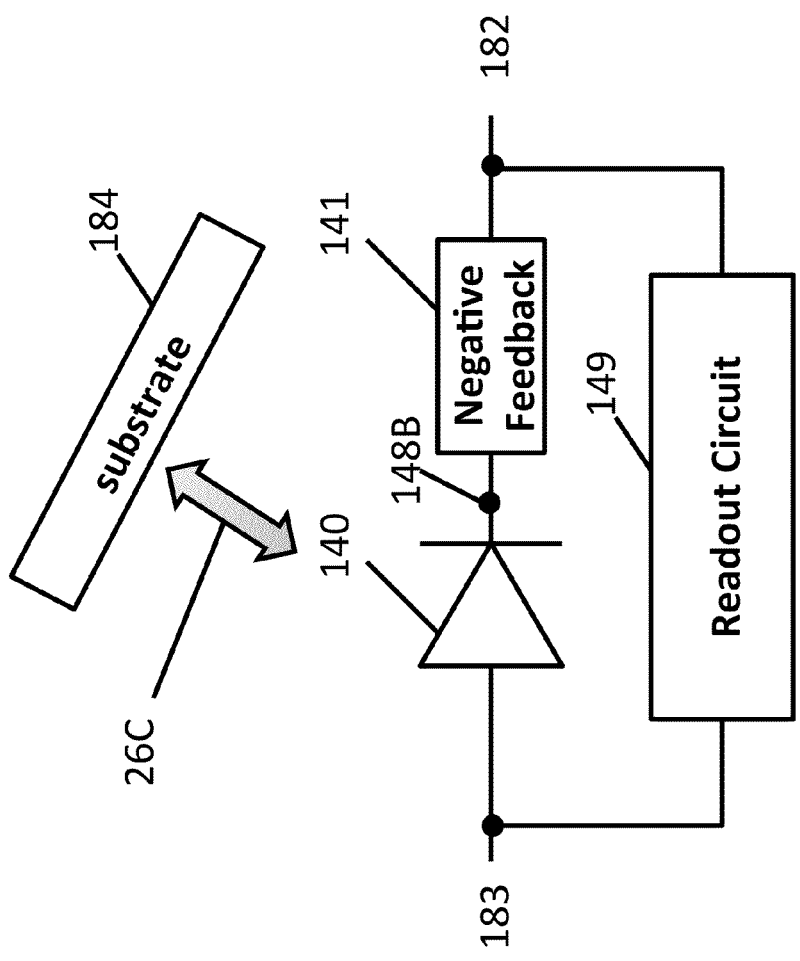
Figure 4D: Alternative Embodiment

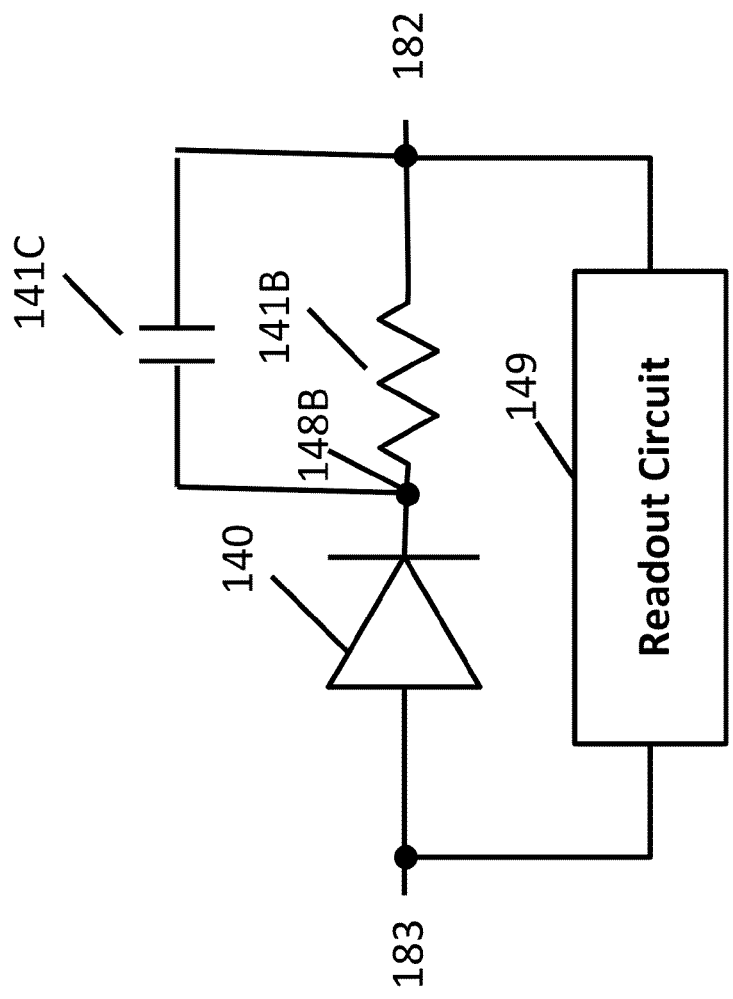
Figure 4E: Alternative Embodiment

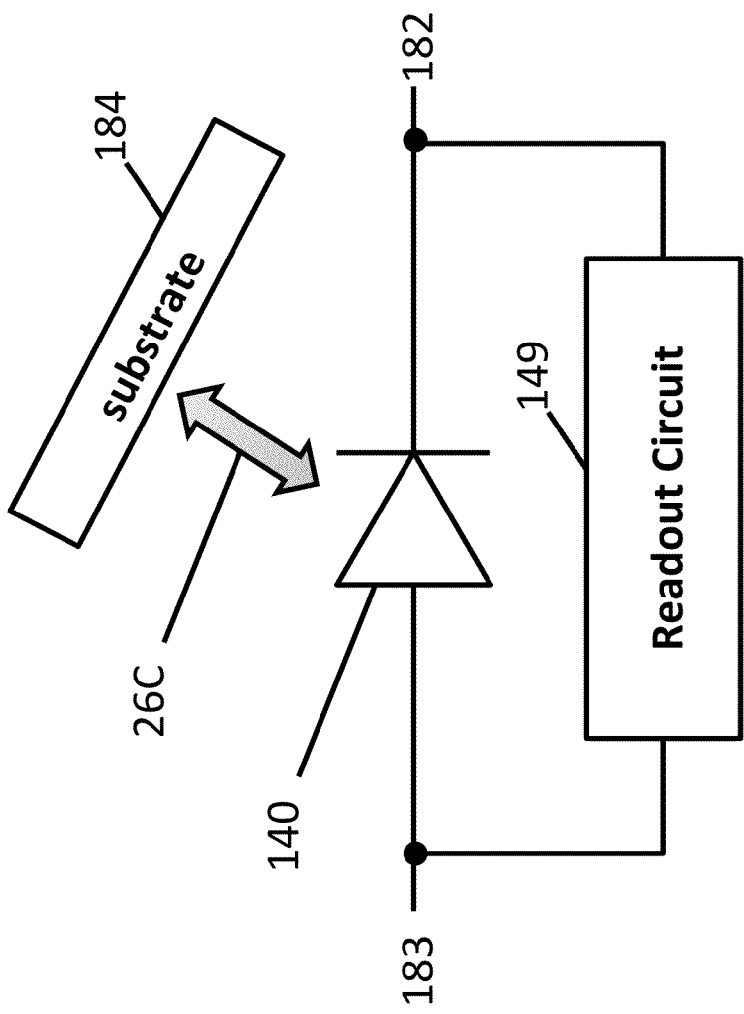
Figure 4F: Alternative Embodiment

Top View

Side View

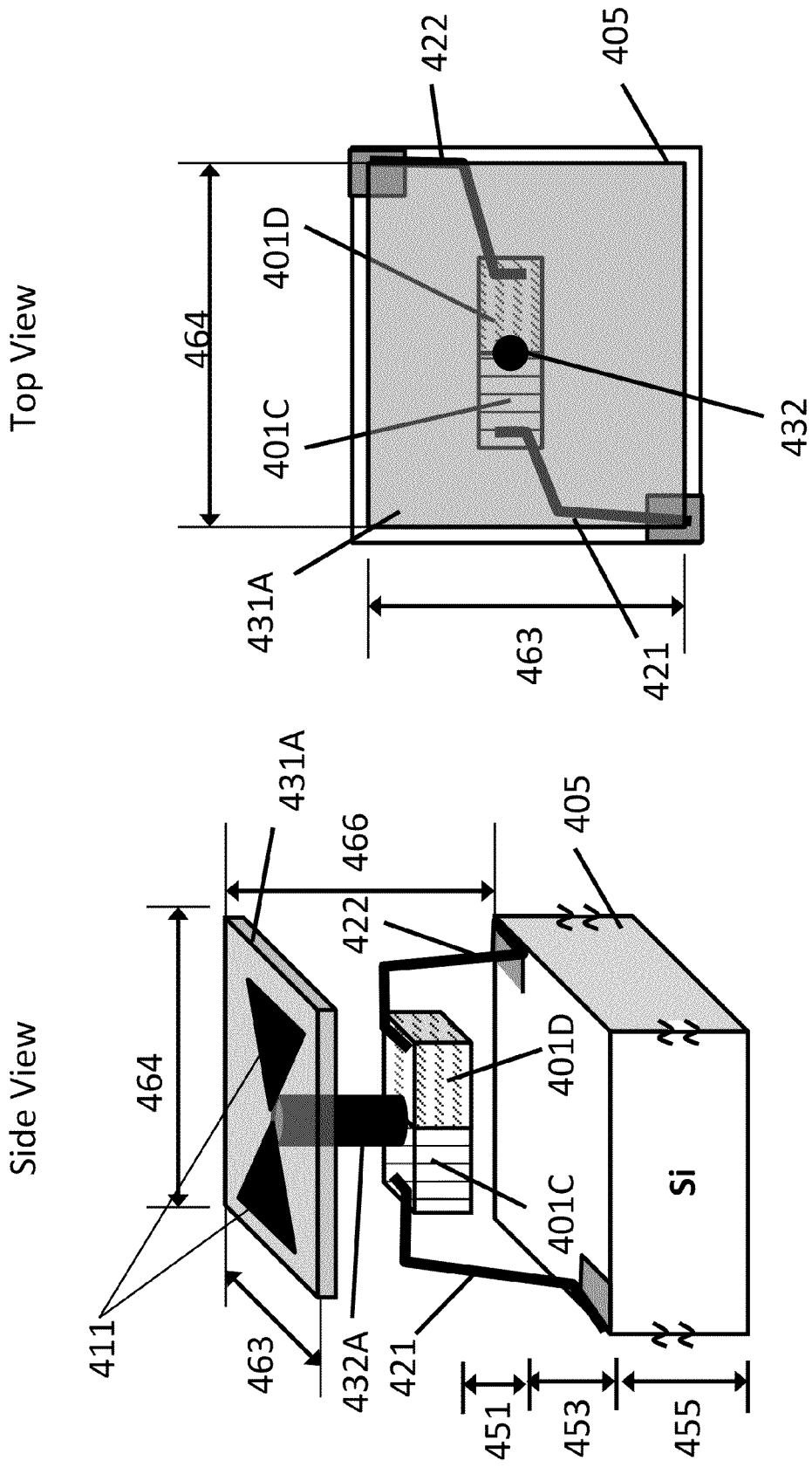

MICROBOLOMETER AND PIXEL EXPLOITING AVALANCHE BREAKDOWN

CROSS-REFERENCE TO RELATED APPLICATION

This application claims priority from two U.S. Prov. Pat. Applications: "L55 Transition Edge Microbolometer" filed Dec. 8, 2009 and assigned application No. 61/283,700 and "L54" filed Apr. 20, 2009 and assigned application No. 61/214,128.

RIGHTS IN USE

The government may have rights in use in patents issuing from this application, as specified in contract HDTRA109P0012.

FIELD OF THE INVENTION

This invention relates generally to the fields of solid state physics and electronics, more particularly to the design and fabrication of semiconductor photodetectors and photodetector arrays, and still more particularly to the design, fabrication and structure of pixels of microbolometers and thermal imagers, and arrays thereof.

BACKGROUND OF THE INVENTION

The high-precision measurement of an object's temperature is an important, technically subtle problem, which in the prior art required expensive, difficult engineering tradeoffs. Principal applications include sensing a point versus imaging a line or area, and contact sensing versus remote sensing. An object's temperature can be measured directly by a sensor in thermally conductive contact with it, convectively by a sensor measuring a fluid in thermally conductive contact with it, and/or radiatively whereby the object's black body radiation is measured by a sensor that does not require direct physical contact and may be remote.

Reference is now made to FIG. 1A, which shows a prior-art temperature measurement device known as a resistance temperature detector or resistance temperature device (RTD). The resistance of the RTD is a function of temperature, so the temperature of the RTD can be determined by simply measuring its resistance, and the change in temperature of the RTD can be determined by measuring the change in resistance. RTDs can use any number of materials which exhibit a change in resistance as a function of temperature, including metals and semiconductors. Platinum is commonly used, with commercial devices made to have a standard resistance at a fixed temperature such as 100 Ω when the RTD temperature is 0° C., and a change in resistance of 0.385 Ω per kelvin, resulting in a resistance coefficient of 0.385% per kelvin. Such RTD sensors promise an accuracy of 0.13 kelvins when measuring a temperature near 0° C., and generally exhibit degraded performance for higher and lower temperatures, unless additional calibrations are made.

In FIG. 1A, the RTD element 1 is connected to a Kelvin bridge circuit. Lead wire 2 connects to one side of the RTD element 1 and lead wire 3 connects to the other side of the RTD element 1 as shown in the figure. Lead wires 2 and 3 should be kept as short as practical, as resistance in these wires may affect the measurement of the RTD temperature. Wires 2A and 2B are connected to wire 2 and wires 3A and 3B are connected to wire 3. Wires 2A and 3A are used to force a current through RTD element 1, with the current being provided by current source 4. Wires 2B and 3B are used to sense the voltage induced on lead wires 2 and 3. The voltage induced on lead wires 2 and 3 is caused by the current flow through the series connection of wire 2, RTD element 1, and wire 3, and follows Ohm's Law, where the voltage is the product of the total resistance and the current produced by current source 4. In a properly designed Kelvin bridge circuit, the current flow through wires 2B and 3B is negligible, such that the voltage drop along wires 2B and 3B is a negligible fraction of the voltage dropped across the RTD element 1, enabling an accurate measurement of the RTD resistance to be made even when wires 2A, 2B, 3A, and 3B are long. Those skilled in the art will recognize that the 4-wire Kelvin bridge can be replaced by a 2-wire resistance measurement provided that the error induced by the resistance of the lead wires is negligible compared to the RTD resistance and the desired accuracy.

Reference is now made to FIG. 1B, which show another prior-art temperature sensor using a silicon semiconductor diode instead of a RTD. The forward-biased voltage across a diode biased to a constant current has a temperature coefficient of about 2.3 mV per kelvin and is reasonably linear. Without calibration, the measurement accuracy of a silicon diode sensor can be as large as ±30 kelvins, since the measured voltage depends on details of the diode area, structure, and non-ideality. Calibrated diodes can achieve an accuracy approaching ±1 kelvins or better. If absolute temperature measurements without calibration are a requirement, one can use two identical silicon diodes, usually monolithically integrated, and operate the diodes by forcing currents I1 and I2 through diodes D1 and D2 respectively, and measuring voltages V1 and V2 across diodes D1 and D2 respectively. The absolute temperature can then be calculated from equation 1 below to achieve an accuracy of about 1 kelvin or better without calibration.

$$T=(V1-V2)/(8.7248\times10^{-5} ln(I1/I2)) \quad \text{(equation 1)}$$

In FIG. 1B, diode D1 is represented by symbol 11A, diode D2 is represented by symbol 11B, current I1 is represented by symbol 14A, current I2 is represented by symbol 14B, voltage V1 is measured by voltmeter 15A, and voltage V2 is measured by voltmeter 15B. Lead wires 12A and 13A are connected directly to diode D1, and lead wires 12B and 13B are connected directly to diode D2. To minimize the resistive voltage drops across lead wires 12A and 13A, a 4-wire Kelvin connection of wires 16A, 16B, 17A, and 17B is used to connect to diode D1. Similarly, to minimize the resistive voltage drops across lead wires 12B and 13B, a 4-wire Kelvin connection of wires 18A, 18B, 18A, and 18B is used to connect to diode D1. Wires 16A and 17A are connected to current source I1. Wires 16B and 17B are connected to the voltmeter 15A. Wires 18A and 19A are connected to current source I2. Wires 18B and 19B are connected to voltmeter 15B. Those skilled in the art will recognize that the diode measurements can force current and measure voltage, as described above. Alternatively, the diode measurement can force voltage and measure current. Note that these prior art measurements of temperature rely on changes in the forward-bias current of diodes, which can be estimated using the ideal diode equation and the temperature dependence of the forward voltage or forward current on the intrinsic carrier concentration.

Remote temperature measurements and power sensors generally fall into a class of detectors called bolometers and calorimeters. A bolometer typically measures the power of incident electromagnetic signal by converting the irradiance into thermal power, and subsequently measuring a corresponding change in temperature. Calorimeters typically measure the energy of incident electromagnetic signals, usually in pulsed measurements and in special cases with a resolution that allows the measurement of the energy of a single photon. Unlike photonic detectors, bolometers measure power absorbed, and hence can be designed to work with any wavelength of incident electromagnetic signals, including (but not limited to): radio wave, microwave, mm wave, THz waves, infrared (including but not limited to) far infrared, long wavelength infrared (LWIR), mid wavelength infrared (MWIR), short wavelength infrared (SWIR), near infrared (NIR)), visible, ultraviolet, X-ray, and gamma ray. Bolometers use a variety of techniques to absorb the electromagnetic energy, including direct absorption in a material; antenna-coupled absorbers (where the temperature rise of a load impedance on the antenna is measured); and a small-area absorber illuminated by an optical system (e.g. lenses & refractors (notably including glass and GRIN lenses), reflectors, gratings & Fresnel lenses, etc.) to achieve a higher temperature rise by concentrating the incident energy on a smaller mass. The term microbolometer refers to a small-area bolometer (typically used in arrays for imaging applications) formed using fabrication techniques from the microelectronics industry (such as lithography, additive processes like deposition, and subtractive processes like etching) that are often collectively termed microelectromechanical systems or MEMs. Numerous microbolometers have been described empirically and theoretically in the prior art. Some significant examples include the following, included herein by reference:

Uncooled Microbolometers:
  For example, see
  Paul W. Kruse, *Uncooled Thermal Imaging Arrays, Systems, and Applications* (SPIE Tutorial Texts in Optical Engineering TT51, 2001).
  Paul W. Kruse, "Uncooled IR Focal Plane Arrays," *Proc. SPIE* 2552, pp. 556-563 (1995).
  R. W. Gooch, T. R. Schimert, W. L. McCardel, and B. A. Ritchey, "Microbolometer and Methode for Forming," U.S. Pat. No. 6,689,014 (Feb. 10, 2004)
  J-J. Yon, A. Astler, M. Vilain, "Thermal Electromagnetic Radiation Detector Comprising an Absorbent Membrane Fixed in Suspension," U.S. Pat. No. 7,294,836 (Nov. 13, 2007).
  G. D. Skidmore, C. G. Howard, "Pixel Structure Having an Umbrella Type Absorber with One or More Recesses or Channels Sized to Increase Radiation Absorption," U.S. Pat. No. 7,622,717 (Nov. 24, 2009)

Phase-Change Microbolometers:
  Fred Volkening, "Transition Edge Detector Technology for High Performance IR Focal Plane Arrays," U.S. Pat. No. 6,576,904 (Jun. 10, 2003).

Superconducting Transition-Edge Microbolometers:
  K. D. Irwin, and G. C. Hilton, "Transition-Edge Sensors" in *Cryogenic Particle Detection* edited by C. Enss, *Topics Appl. Phys.* 66, pp. 63-149 (2005).
  K. D. Irwin, "Phonon-Mediated Particle Detection Using Superconducting Tungsten Transition-Edge Sensors," Thesis Dissertation to Stanford University Department of Physics, 1995.
  K. D. Irwin, "An application of electrothermal feedback for high resolution cryogenic particle detection," *Appl. Phys. Lett.*, 66, pp. 1998-2000 (1995).
  M. Galeazzi, and D. McCammon, "Microcalorimeter and bolometer model," *J. Appl. Phys.*, 93(8) pp. 4856-4869 (2003).
  M. J. M. E. de Nivelle, M. P. Bruijn, R. Dde Vries, J. J. Wijnbergen, P. A. J. de Korte, S. Sanchez, M. Elwenspoek, T. Heidenblut, B. Schwierzi, W. Michalke, and E. Steinbeiss, "Low noise high-$T_c$ superconducting bolometers on silicon nitride membranes for far-infrared detection," *J. App. Phys.*, 82(10) pp 4719-4726 (1997).
  I. A. Khrebtov, K. V. Ivanov, and V. G. Malyarov, "Noise properties of high-$T_c$ superconducting transition edge bolometers with electrothermal feedback," *Proc. SPIE* v. 6600, paper 660014 (2007).
  Irwin et al., "Application of Electrothermal Feedback for High Resolution Cryogenic Particle Detection using a transition edge sensor," U.S. Pat. No. 5,641,961.

High sensitivity can be achieved in bolometer or microbolometer by exploiting a "transition edge" effect, whereby some property that changes rapidly over a small temperature range offers a way to measure the property (e.g. resistance) with high sensitivity despite the change in temperature being small. For example, superconducting transition-edge sensors exhibit several orders of magnitude change in conductivity across the transition edge between superconducting and normal resistivity states, and the width of the transition edge can be narrower than 1 kelvin wide. Also, many sources of thermal noise are strongly reduced because some superconducting transition edge sensors operate at very low temperatures (typically below 4.2 K). High performance is still achieved when using high temperature superconductors at temperatures around 77 K and phase change materials at higher temperatures (e.g. near 300 K or room temperature). Transition edge sensors often take advantage of an electrothermal feedback loop that stabilizes the operational temperature of the device and speeds the effective thermal time constant. Additional References describing aspects of transition edge devices and electrothermal feedback include:

M. Galeazzi, "An external electronic feedback system applied to a cryogenic μ-calorimeter," *Rev. Sci. Instrum.*, 69(5) pp. 2017-2023 (1998).
  G. Neto, L. Alberto, L. de Almeida, A. M. N. Lima, C. S. Moreira, H. Neff, I. A. Khrebtov, and V. G. Malyarov, "Figures of merit and optimization of a $VO_2$ microbolometer with strong electrothermal feedback," *Optical engineering* 47(7) paper 073603 (2008).
  S. H. Moseley, J. C. Mather, and D. McCammon, "Thermal detectors as x-ray spectrometers," *J. Appl. Phys.* 56(5) pp. 1257-1262 (1984).
  M. Buhler, E. Umlauf, and J. C. Mather, "Noise of a bolometer with vanishing self-heating," *Nuclear Instruments and Methods in Physics Research A* 346, pp. 225-229 (1994).
  J. C. Mather, "Bolometer noise: nonequilibrium theory," *Applied Optics.* 21(6) pp. 1125-1129 (1982).

Reference is now made to FIG. 2, which shows a diagram prior art microbolometer pixel 24. A microbolometer pixel includes a temperature sensing element 23, an absorber 21, which is designed to absorb an incident electromagnetic signal 22 (denoted $P_{EM}$) with good efficiency and couple the $P_{EM}$ into 23, and connections 25A and 25B to the substrate. Connections 25A and 25B provide mechanical support to isolate the absorber 21 and temperature sensing element 23 from substrate 29. Connection 25A includes mechanical support member 27A and an electrical connection 28A. Connection 25B includes mechanical support member 27B and electrical connection 28B. Those skilled in the art will recognize that a microbolometer must have, at a minimum, one mechanical support member and two electrical connections; the connections to the substrate illustrated above can be generalized to include more mechanical support and more electrical connections, especially for bridge measurement techniques. Additionally, as illustrated in FIG. 2, electrical connections 28A and 28B will have an associated resistance 33A (denoted R3) and 33B (denoted R4), respectively. Electrical current 32A (denoted I3) flows through resistance 33A, and electrical current 32B (denoted I4) flows through resistance 33B. The voltage of the temperature sensing element 23 is 31A (denoted V3) at connection 25A and 31B (denoted V4) at connection 25B. Connections 25A and 25B provide a thermal link between the temperature sensing element 23 and substrate 29, transferring heat in the form of lattice vibrations (phonons) and energetic electrons (hot electrons). The heat power transferred between the substrate 29 and the sensing element 23 through connection 25A is denoted P1. The heat power transferred between the substrate 29 and the sensing element 23 through connection 25B is denoted P2. In order to achieve good sensitivity to the incident electromagnetic power $P_{EM}$ it is advantageous for the thermal conductivity G to substrate 29 be small. Thermal conductivity G is dependent on P1 and P2, which are influenced by the thermal conductivity of connections 25A and 25B. In addition to thermal conductions through connections 25A and 25B, microbolometer pixel 24 will exchange black-body photons 30 (denoted $P_{BB}$) with its surroundings, which sets a lower bound on the thermal conductivity.

Absorption of incident electromagnetic energy 22 occurs in absorber 21. A microbolometer may use any absorber 21 that efficiently converts incident electromagnetic energy 22 into thermal energy, since this thermal energy raises the temperature measured at and by sensing element 23. Efficient absorption is assisted by minimizing reflection and by providing a material with a high density of free electrons, such as a thin metallic layer of TiN, NiCr, Ti, Mb, and their oxides. The thickness of the metallic absorber is chosen to have an impedance matching that of free space (approximately 377 $\Omega$), which works out to a typical thickness between 1 nm and 50 nm. Absorption is generally increased by placing the absorber in an optical cavity tuned to achieve high absorption of the wavelengths of interest.

An alternative to using a metallic thin-film absorber is to use an antenna structure to absorb the incident electromagnetic energy 22, converting the electromagnetic energy into a current (see for example: Bluzer et al., U.S. Pat. No. 7,439,508, (Oct. 21, 2008) and S-W Han and D. P. Neikirk, "Design of infrared wavelength-selective microbolometers using planar multimode detectors," *Proc. SPIE* 5836, pp. 540-557 (2005)). This current is used to heat a resistive element placed on or near the temperature sensing element 23. Note that in the antenna coupled designs, it is still necessary to maintain high thermal isolation between the temperature sensing element 23 and substrate 29, so the electrical and mechanical connections to the antenna should be designed to minimize thermal conductivity to substrate 29.

State of the art microbolometers for imaging long wave infrared (LWIR) typically use microbolometer pixels 24 with a pixel pitch of 15-50 µm. Each microbolometer pixel 24 has a thermal heat capacity C and a thermal conductivity to its surroundings of G. The incident electromagnetic power $P_{EM}$ causes the temperature of the microbolometer pixel 24 to increase with respect to the case $P_{EM}$=0). Typically, the temperature of microbolometer pixel 24 will be higher than that of substrate 29, so heat will be transferred to the substrate, with the thermal conductivity described by the parameter G. The time constant, $\tau$ for temperature changes of microbolometer pixel 24 is generally estimated from $\tau$=C/G. State of the art microbolometers typically achieve thermal time constants of 1-100 msec, with G between 10 nW/K and 100 nW/K and C between 10 pJ/K and 1000 pJ/K.

Several important noise sources are worth enumerating:
1. Temperature fluctuation noise, caused by the quantum fluctuations in the temperature arising from the flow of heat between the absorber and the substrate through the thermal link with thermal conductivity G. This noise scales as $\sqrt{(kT^2G)}$, and can only be reduced by lowering G. Note that thermal conductivity includes thermal conduction through connection 25A and 25B, black body photons 30 which exchange energy with the surroundings, and may include a component due to thermal conduction through gas molecules (which is why most microbolometers are placed within a vacuum).
2. In addition to the background limit, there is often a minimum G that can be used in a microbolometer because the system must maintain a minimum thermal time constant ($\tau$=C/G). Since C is often fixed by processing considerations, it is not practical in the prior art to reduce G indefinitely.
3. In addition to the limit of thermal conductivity through connection 25A and 25B, there is a background limit to the NETD, which is caused by the fluctuation noise in the black-body photons 30 being exchanged between the detector and its surroundings. Photons can be exchanged between the microbolometer and the target, between the microbolometer and the camera body, and between the microbolometer and the substrate. This photon exchange has an associated shot noise that can be calculated as shown in FIG. 3.
4. Readout noise limits arise from a number of causes that impact the signal-to-noise ratio of the microbolometer, and therefore the NETD. These noise sources are well described in the literature, so are only mentioned by name here:
    a. Johnson noise
    b. 1/f noise
    c. Current shot noise
5. Gain noise: while most standard resistive microbolometers do not use gain (i.e. amplification within the detector device itself), alternative approaches may use gain mechanisms. In general, gain is not noiseless, and will have an associated excess noise, which is the additional noise (beyond the shot limit) imposed on the signal by the gain process. As such, the excess noise factor degrades the SNR and therefore the NETD.

Reference is now made to FIG. 3. The performance of a microbolometer is often specified in terms of the noise-equivalent temperature difference (NETD), or identically as the noise-equivalent difference in temperature (NEDT). An example of the bound set by the NETD is calculated for a specific microbolometer. FIG. 3 shows that there is a limit to the minimum achievable NETD for a given value of the thermal conductivity. In general, a microblometer will exhibit a degraded (higher) NETD than the limits shown in FIG. 3 because there will be other sources of noise in the microbolometer system including its packaging and optics.

FIG. 3, which shows the relationship between thermal conductivity G and the lower bound on NETD performance. Axis 99 shows the thermal fluctuation noise limit for NETD, with the logarithmic scale running from 0.1 mK to 1000 mK. Axis 98 is the thermal conductivity G, with the logarithmic scale running from $10^{-10}$ W/K to $10^{-4}$ W/K. The NETD limit is calculated assuming a 25 µm×25 µm pixel size with 100% fill factor on the absorber, f/1.0 optics with 90% transmission, and a 30 Hz bandwidth. Furthermore, the calculation assumes the microbolometer has a $2\pi$ sR field of view for black body irradiative photons from the surrounding camera body. Curve 90 shows the lower bound on NETD for this microbolometer assuming a target temperature of 300 K, a microbolometer temperature of 300 K, and a camera body temperature of 300 K. Curve 91 shows the lower bound on NETD for this microbolometer assuming a target temperature of 300 K, a substrate temperature (supporting the microbolometer) of 77 K, and a camera body temperature of 300 K. Curve 92 shows the lower bound on NETD for this microbolometer assuming a target temperature of 300 K, a substrate temperature of 77 K, and a camera body temperature of 77 K. This lower bound on NETD performance occurs due to the thermal fluctuation noise limit, which scales as $\sqrt{(kT^2G)}$. For thermal conductivity values below about $2 \times 10^{-9}$ W/K, a further reduction in G does not improve NETD because the lower bound on NETD becomes dominated by the radiative fluctuation noise of black body photons exchanged between the microbolometer pixel and the camera body, as well as the radiative fluctuation noise of black body photons exchanged between the microbolometer pixel and the scene to be imaged. Cooling of the microbolometer and substrate improves the lower bound on NETD since thermal fluctuation noise scales as $\sqrt{(kT^2G)}$. Cooling of the camera body reduces the radiative fluctuation noise of the black body photons exchanged between the camera body and the microbolometer.

LIMITATIONS OF THE PRIOR ART

In general, prior-art bolometers and microbolometers suffer from poor thermal sensitivity, poor temperature resolution, high noise, and low bandwidth, particularly when operated near room temperature or above. Most importantly, it is generally necessary to operate within a narrow temperature range near the transition edge when using a high-performance prior-art bolometer or microbolometer that makes use of a phase change or chemical change, such as those using the phase change of a superconductor (superconducting/normal conducting phase change), magnetic (phase change of the magnetic susceptibility at the Curie temperature), molecular reconfigurations, or metal-insulator phase change (such as in vanadium oxides). This is a key failing. In addition, many of these transition edge sensors suffer from hysteresis in the transition edge which further degrades performance.

The performance of a transition edge sensor is partly determined by the sharpness of the transition edge, with sharper transition edges providing higher performance (i.e. higher sensitivity to small temperature changes). This means that higher sensitivity is achieved by making a device with a narrow transition edge width. However, such narrow transition widths mean that the operating temperature of the sensor has to be maintained within an appropriate temperature window, limiting the sensitivity to higher and lower temperatures. In addition, the temperature window is largely defined by the manufacturing process, which complicates changing it quickly or substantially when the device is operating.

The prior art also suffers from high thermal conductivity in the thermal link between the thermal absorber and the substrate, limiting the device's thermal sensitivity. Prior art attempts to lower the thermal conductivity over the thermal link have not been successful because the thermal link also provides physical (mechanical) support for the absorber and a means of electrical connection to the thermal measurement sensor.

The prior art also suffers from high excess electrical noise, particularly Johnson noise, shot noise, and 1/f noise.

OBJECTS OF THE INVENTION

The preferred embodiment of this disclosure teaches the invention using an avalanche transition edge to measure temperature, changes in temperature, and/or the heat flux incident on a temperature sensor. The invention may be used to measure the temperature and changes in temperature of bolometer elements, including microbolometer pixels. Principal objects of the present invention include increasing the sensitivity of temperature measurements and thermal images; decreasing noise (such as 1/f noise, excess noise, Johnson noise, shot noise, preamplifier noise, thermal link noise, and background camera noise); allowing the sensor to be operated at any temperature from near absolute zero to hundreds of degrees Celsius (notably including near room temperature and at cryogenic temperatures); operating without temperature stabilization (especially by thermoelectric cooling, heating, or cryogenic fluid); operating over an expanded range of current and/or voltage; operating without employing a materials phase change or chemical change; and not employing a superconducting state. Further objects of the invention include operating the device within a feedback loop to extend dynamic range while maintaining highest sensitivity, including operating within an electrical feedback loop to maintain optimal voltage and/or current-biasing, and/or operating within a electrothermal feedback loop to maintain the sensor at an optimal operating temperature. The electrical and electrothermal feedback loops may be independent or combined into a plurality of feedback loops. The invention also includes means for achieving low thermal conductivity in the thermal link between the absorber, in order to lower the thermal fluctuation noise; and means for reducing the absorption of background photons from the camera body (e.g. background photons), in order to lower the background noise associated with these photons.

It should also be noted that the teachings herein regarding measurement of relative temperature changes enable the invention with respect to absolute temperatures, and vice versa, so long the cases are appropriately time-dependent or time-independent.

BRIEF DESCRIPTION OF THE INVENTION

The invention teaches device structures capable of achieving high-precision temperature measurement capability, as well as methods for operating such devices. Unlike prior art devices, the invention advantageously uses real-time adaptive biasing to achieve operation in a transition edge region of a device at any operating temperature. This ability to use real-time adaptive biasing to operate within (or near) the transition edge referenced to any operating temperature of interest allows a microbolometer device to take advantage of the transition edge under any operating condition rather than being limited to a narrow operating temperature range.

Specifically, the invention exploits the exquisite temperature sensitivity of collisional impact ionization, which feeds back into a chain reaction, resulting in a sharp avalanche breakdown at a so-called "transition edge."

Impact ionization multiplication depends sensitively on details of the absorber region (material composition & exact 3D shape), applied electric field (which can be under the sensor device's real-time control), and of course the absorber's temperature. The temperature dependence of the avalanche breakdown transition edge looks like a sharp, nearly vertical transition between a low-conductivity state (where impaction ionization multiplication is low) and a high-conductivity state (where the impact ionization multiplication is high).

A device in accordance with the invention will experience many impact ionization events per measurement time slot, e.g. thousands per msec. Criteria for achieving impact ionization events include (a) an electric field large enough for there to be a non-negligible probability of impact ionization occurring and (b) a source of free carriers to initiate the impact ionization events.

In effect, an avalanche breakdown transition edge sensor measures the change in the product of the impact ionization gain and the number of initial free carriers incident on the high field region as a function of temperature. To maximize the temperature sensitivity of a sensor, it is desirable to operate in the regime of rapidly changing gain, and in a regime of low noise. Impact ionization multiplication gain is generally noisy due to the statistical nature of impact ionization events. It is therefore desirable to stabilize the impact ionization multiplication gain, which can be achieved by a number of means incorporated by reference into this invention. In addition, it is desirable to achieve a stable number of incident free carriers, as this is the second factor in the total current measured in the impact ionization transition edge temperature sensor. Incident free carriers can be inherent to the device (such as the "dark current" caused by thermal generation of free carriers in any diode structure), or derive from an external source, such as a light source (LED or laser) that causes photogeneration of free carriers within the device. It is desirable for the free carrier generation rate per measurement interval to be high enough to avoid shot noise (e.g. many thousands of free carriers incident on the device's high field region), and therefore provide a stable output impedance at a given temperature and bias condition.

In general, impact ionization multiplication occurs when the electric field is large enough for free carriers to accelerate to a high enough energy to cause impact ionization events. The high field region is where most of the impact ionization events occur, so the location of gain (also called amplification or carrier multiplication) in the device. Each ionization event results in the production of an electron-hole pair and conserves energy by reducing the excess energy of the incident electron or hole. A single carrier can undergo multiple impact ionization events, and the secondary carriers generated by an impact ionization event can also cause further ionization events, enabling high gains to be achieved through a so-called "chain reaction."

The preferred embodiment of this invention exploits the avalanche breakdown transition edge. The avalanche breakdown transition edge is the regime where the probability of impact ionization events is high, and where the slope of gain versus bias voltage is very steep. Alternative embodiments achieve even higher temperature sensitivity by exploiting electrical feedback, electrothermal feedback, or both forms of feedback.

The avalanche breakdown transition edge is sharpened where impact ionization is caused by both electrons and holes rather than predominately one particle type, because feedback occurs between the electron ionization events (which produce an additional electron-hole pair) and hole ionization events (which also produce an electron-hole pair) with the electrons and holes traveling in opposite directions with respect to the electric field. This feedback speeds and increases the avalanche multiplication gain, causing the gain to tend towards infinity (runaway to burn-out) until limited by an external factor such as temperature, electric field screening, or external circuitry. It is an important aspect of the invention to stabilize the impact ionization gain, which can be achieved through any of a number of well-known methods. For instance:

1. Electrical negative-feedback stabilization: Incorporating a series-connected current-limiting circuit (illustratively, a resistor) stabilizes the circuit as follows: An impact ionization event causes high instantaneous gain, so the current through the resistor increases suddenly and the voltage drop across it also increases (by Ohm's Law). A greater voltage drop across the resistor lowers the total magnitude of the voltage bias across the avalanche device, so lowers or stops the avalanche gain. Such an electrical negative feedback loop can operate in the psec to μsec range, depending on design and the level of integration. Electrical negative-feedback stabilization is not limited to resistive feedback alone, but can make use of other passive (e.g. capacitor, inductor) or active (e.g. diode, transistor, thyristor) elements to improve the feedback response.

Two kinds of electrical negative feedback stabilization are worth detailing: linear mode avalanche gain stabilization and Geiger mode avalanche gain stabilization. In linear mode avalanche gain stabilization, the impact ionization gain is a rapid function of bias (e.g. exponential), such that a small change in bias results in a large change in gain. A series-connected current-limiting device provides a fast negative feedback loop to stabilize the gain. For example, consider a device with a very sharp impact ionization transition edge such that the average gain for bias voltage V is small (e.g. $10^1$) while gain for a small increment of $\Delta V$ is very large (e.g. greater than $10^5$). Since the transition from bias V to bias V+$\Delta V$ results in four orders of magnitude change in the current I, it is straightforward to choose a resistor value $R_{feedback}$ such that V+$\Delta V$−I×$R_{feedback}$ acts to stabilize the gain at a value between the small value (e.g. $10^1$) and the large value (e.g. $10^5$). Since the device current I is a function of both the gain and the incident current (i.e. dark current+light current), such gain stabilization also requires that the device achieve a stable incident current.

Geiger mode feedback stabilization is described in Harmon et al., U.S. Pat. App. No. 20040245592, "Solid-State Microchannel Plate Photodetector," filed May 1, 2004. In the Geiger mode of operation, the device gain is primarily determined by the total device capacitance, the excess bias, and the quenching circuit (which normally consists of a parallel-connected current-limiting resistor and bypass capacitor, series-connected to the Geiger diode junction). Geiger mode devices can be built with very low noise on their multiplication gain. If a Geiger mode avalanche photodiode (APD) device is driven by a series of free-carrier pulses well-separated in time, then the device will detect the free carrier and output a well-defined current pulse for each detection event. A very simple method to provide such a series of free carriers is periodically to inject a pulse of free carriers, such as can be achieved optically (using a pulsed LED or pulsed laser diode) or electrically (such as pulsing the forward bias of a bipolar junction transistor to inject minority carriers into the base region, from which the carriers subsequently diffuse into the base-collector depletion region, where the field in the base-collector depletion region can be high enough to initiate impact ionization multiplication). Note that it is desirable for the optical or electrical injection to create hundreds or thousands of free carriers to ensure that the Geiger mode detection probability is well above 90%, or 99%, etc. It is also desirable that the Geiger mode APD exhibit a very low probability of after-pulsing, which would otherwise be a source of noise in these devices. Note that there are well known techniques in the literature for achieving low after-pulsing rates, including using long reset times or very high quality single crystal semiconductor materials in the active region of the device.

Finally, we note that the primary difference between linear mode gain stabilization and Geiger mode gain stabilization is the magnitude of the series resistor (or other current limiting circuitry). If the series resistor is large enough and the device exhibits a low enough dark current, the device operates in the so-called "passive quench" Geiger mode of stabilization, where the bias across the device swings from V (often called the breakdown voltage) to V+ΔV (where ΔV is usually called the excess bias), and ΔV is often >1 Volt. Here, the bias across the device swings between V and V+ΔV with a time constant of $R_{quench} \times C$ (where $R_{quench}$ is the series resistance, often referred to as the quench resistor, and C is the total device capacitance), which is typically designed for long time constants (R×C>10 nsec). If the series resistor is smaller or the device exhibits a large dark current (or both), the device latches On and operates in the linear mode of stabilization, where the bias across the device is modulated around V+ΔV−I×$R_{feedback}$. In this linear mode of stabilization, the voltage swings are usually much smaller, with the result that the average voltage bias and current through the device are stabilized with respect to time constants that are substantially longer than the avalanche build up time constant, where the avalanche build-up time constant is typically faster than 1 nsec.

Although the linear and passive Geiger modes of feedback stabilization are described above, the invention anticipates other forms of electrical feedback stabilization, including pulsed biasing in Geiger mode, active quenching in Geiger mode, external feedback loops incorporating transistor gain or other means of gain, and operation in a mixed mode of both linear and Geiger mode feedback.

In addition, we note that in the Geiger mode of operation, the count rate itself can be used to monitor the temperature. Since the single photon detection probability is proportional to the excess bias ΔV, and the excess bias is related to the temperature, then the count rate (dark count rate or illuminated count rate) will also be proportional to temperature. So, when an APD operated in Geiger mode is biased at a constant total voltage, the count rate (or total integrated current) can be used to monitor temperature.

2. Electrothermal negative-feedback stabilization: Because the magnitude of the avlanche breakdown voltage of the preferred device increases at higher temperatures, operation at a constant voltage has the effect of providing an electro-thermal negative-feedback loop. A small increase in temperature will cause the magnitude of the avalanche breakdown voltage to increase, in turn causing the gain of a device operated at constant voltage to decrease. This decrease in avalanche gain reduces the current I and power dissipation I×V, allowing the device to cool. Similarly, a small decrease in temperature will cause the magnitude of the avalanche breakdown voltage to decrease, in turn causing the gain of a device operated at constant voltage to increase. This increase in the avalanche gain increases the current I and power dissipation I×V, heating the device. The result is a stabilization loop that equilibrates device temperature and power dissipation to maintain the device at a steady temperature and power dissipation. This negative thermal feedback loop is much slower than a negative electrical feedback loop, with time constants ranging from roughly 1 μsec to 1 sec. Electro-thermal negative feedback stabilization is described in detail in the preferred embodiment.

3. Both electrical and electro-thermal negative-feedback stabilization may be used in concert. Note that constant-current and constant-voltage operation are extremes. An infinity of time-dependent and time-independent operating modes exist as combinations in-between, notably including small-signal perturbations and lock-in methods superposed on an underlying method. In general, the impact ionization transition edge will be monitored in the transition region, choosing the operating point to achieve the desired load impedance and noise characteristics. The impact ionization transition edge can be monitored using constant-voltage, constant-current, variable voltage, variable current, constant resistance, variable resistance, or any other means of monitoring the current voltage characteristic of the device.

BRIEF DESCRIPTION OF THE FIGURES

FIG. 1A shows a prior art Resistance Temperature Device (RTD) for measuring temperature.

FIG. 1B shows a prior art means for measuring temperature using a matched pair of diodes.

FIG. 2 shows a prior art microbolometer structure.

FIG. 3 shows the physical limitations on NETD as a function of substrate to microbolometer thermal conductivity.

FIG. 4A shows the epitaxial layer structure of the preferred embodiment.

FIG. 4B shows a diode structure fabricated in accordance with the preferred embodiment.

FIG. 4C shows an electrical circuit in accordance with the preferred embodiment.

FIG. 4D shows an alternative electrical circuit in accordance with the invention.

FIG. 4E shows another alternative electrical circuit in accordance with the invention.

FIG. 4F shows another alternative electrical circuit in accordance with the invention.

DETAILED DESCRIPTION OF THE FIGURES

Figure 5A:
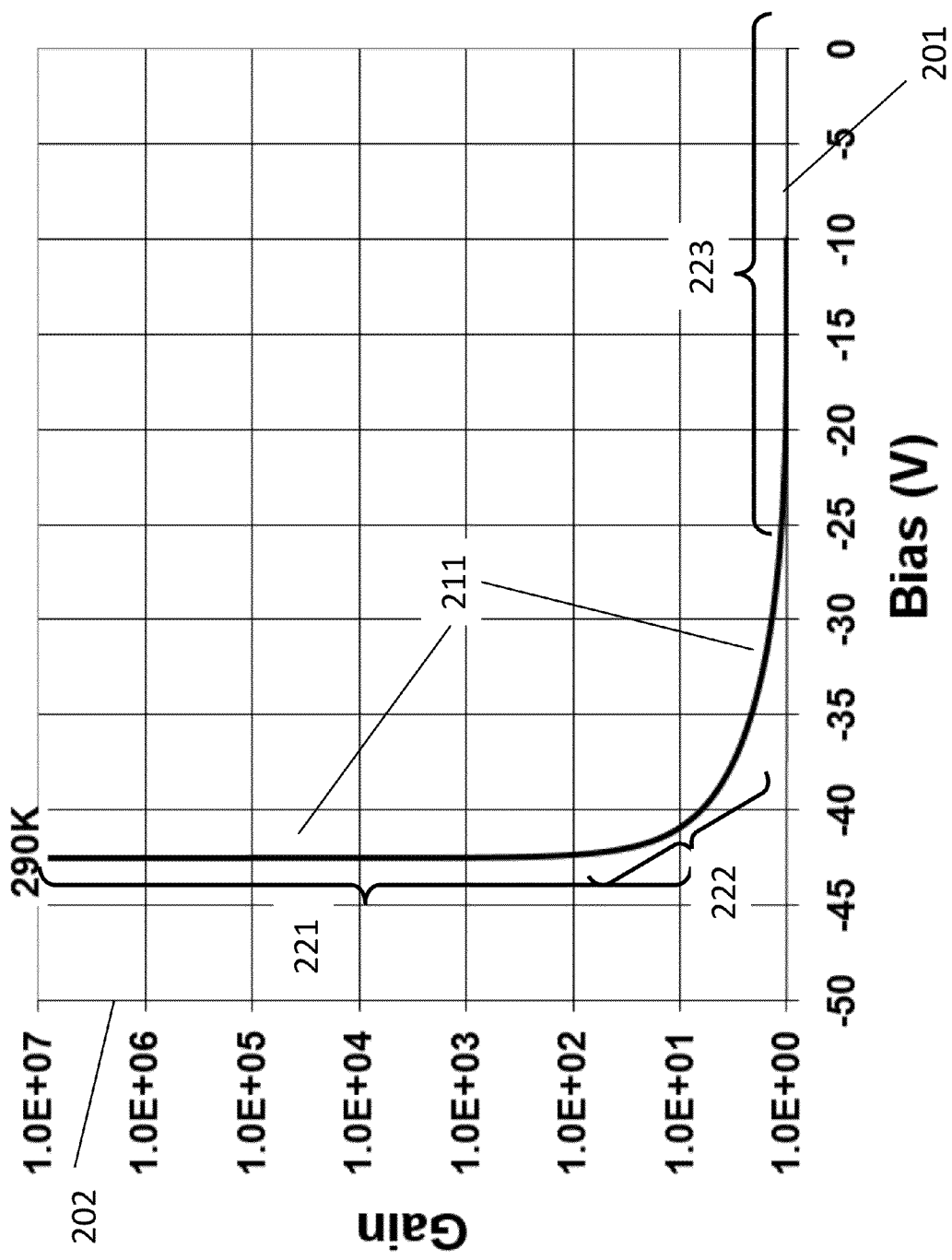
FIG. 5A shows the calculated current-voltage (I-V) curve of the diode structure of FIG. 4A when operated at 290K.

Reference is now made to the preferred embodiment of FIG. 4A. The preferred embodiment of the invention consists of a diode junction and electromagnetic absorber in good thermal contact with one another, both sitting on a platform isolating them thermally from a substrate. The legs of the platform advantageously carry the wiring to/from the diode junction while providing mechanical support. Irradiant electromagnetic radiation provides the thermal link to the diode junction from the object being sensed. Readout circuitry and a resistor in electrical series with the diode junction prevent the reverse-biased diode current from running away. The preferred embodiment exploits negative electrothermal feedback to servo the thermal mass comprising the diode junction and electromagnetic absorber to a constant temperature with respect to the substrate. The diode junction is operated under constant-voltage biasing conditions so that the power dissipated by current through the diode scales inversely as the incident irradiant electromagnetic power. 1-point or 2-point calibration ahead-of-time allows conversion of the voltage reading into temperature.

This is realized as a silicon PIN diode structure that can be grown epitaxially on a silicon-on-insulator (SoI) substrate. The SoI substrate includes substrate 110, $SiO_2$ insulator layer 108 of thickness 158, and n-type silicon layer 107 of thickness 157. Layer 108 is used to provide thermal isolation to the substrate, and, in generally a lateral undercut wet etch will be used to remove all or most of layer 108 to increase thermal isolation between the silicon PIN diode junction structures (including layers 107, 105, and 103) and the substrate 110. Thickness 158 of layer 108 can be chosen to allow for easier processing of the wet etch, and, for microbolometer applications, the thickness 158 of layer 108 can be chosen to improve the absorption of the incident electromagnetic radiation $P_{EM}$. The n-type silicon layer 107 has a thickness 157, and will be doped to achieve donor concentration of $10^{18}$ cm$^{-3}$. On top of layer 107 is epitaxially deposited layer 105, consisting of a nominally undoped silicon layer grown to a thickness 155 of 0.75 μm. On top of layer 105 is grown Layer 103 is a p-type silicon layer doped to achieve an acceptor concentration of $6\times10^{16}$ cm$^{-3}$ with a thickness of 153. On top of layer 103 is layer 101, a silicon nitride ($Si_3N_4$) passivation layer, grown to a thickness 151.

Those skilled in the art will recognize that the invention encompasses a number of variants. For instance, a variety of current and future epitaxial techniques could be used to grow ("deposit") these layers including atomic layer deposition (ALD); chemical vapor deposition (CVD), such as plasma-enhanced CVD (PECVD), metallo-organic CVD (MOCVD), and low pressure CVD (LPCVD); physical vapor deposition techniques like molecular-beam epitaxy (MBE); and liquid-phase epitaxy (LPE). These growth techniques can deposit the silicon, germanium, carbon, gallium, aluminum, indium, zinc, antimony, arsenic, nitrogen, phosphorous, oxygen, or sulfur that typically comprise at least 10% of the atoms in a semiconductor device. Diode junctions can also be implemented in a nanotube, nanowire, field-effect device, junction device, heterojunction device, or contact device; and/or implemented in a PN junction, PIN junction, MIM diode junction, MIS diode junction, MOS diode junction, SIS diode junction, or MS diode junction (e.g. a Schottky diode junction).

Those skilled in the art will also recognize that alternative passivating layers can be used, including mixtures of $SiO_2$ and $Si_3N_4$, $Al_2O_3$, and many other means of surface passivation used in semiconductor manufacturing; and that different doping densities, thicknesses, and epitaxial steps can readily be used to form a diode junction structure, including diode junction structures within 3-terminal devices. Alternative embodiments of the invention include all forms of semiconductor devices acting as diode junctions (such junctions also known simply as diodes), including epitaxial PIN diode junctions, epitaxial PN diode junctions, implanted/diffused PN diode junctions, lateral PIN and PN diode junctions, and other diode junction structures, including metal-semiconductor diode junctions (also called Schottky diode junctions), metal-insulator-semiconductors diode junctions (MIS diode junctions), metal-oxide-semiconductor diode junctions (MOS diode junctions), and more generally structures that can achieve a sufficiently high field across a semiconductor region to achieve impact ionization multiplication and avalanche breakdown. The use of compound semiconductors instead of silicon, or in addition to it, is expressly anticipated.

Reference is now made to the preferred embodiment depicted in FIG. 4B, which shows how an impact ionization breakdown edge temperature sensor can be fabricated from the epitaxial layer stack of FIG. 4B. Conventional photolithographic masking steps are used to define the lateral extent of the PIN diode mesa, which can have lateral dimensions 191 and 192A and 192B ranging from less than 1 μm to more than 100 μm, depending on the desired size of the temperature sensor. Region 101A corresponds to the remaining portion of layer 101 after etching. Region 103A corresponds to the remaining portion of layer 103 after etching. Region 105A corresponds to the remaining portion of layer 105 after etching. Region 107A corresponds to the remaining portion of layer 107 after etching. In the preferred embodiment, the lateral diode geometry is round. Those skilled in the art will recognize that alternative lateral geometries can be used, including oval, square, rectangular, or any other desired shape. Contact lead 180 is made to the p-type layer 103 of the device, by etching a hole in the $SiO_2$ passivation layer 101, and depositing a suitable ohmic contact to p-Si. Contact 180 is connected to substrate 109 through interconnect 183, resistor 141A, and interconnect 183B. Interconnect 183 uses a so-called air bridge (actually a vacuum bridge) structure to provide good thermal isolation between the diode (inclusive of regions 101A, 103A, 105A and 107A) and substrate 109. Contact 181 is made to the n-type layer 107, by depositing a suitable ohmic contact to n-type silicon. Contact 181 is connected to substrate 109 through interconnect 183, which uses a so-called air bridge (really a vacuum bridge) structure. Note that interconnects 182 and 183 serve two purposes, providing both electrical connections and mechanical support to the mesa structure (when the insulating layer 107 is removed); this makes it advantageous for interconnects 182 and 183 to incorporate additional layers such as a silicon oxynitride glassivation to provide mechanical support. To increase the thermal isolation between the mesa structure (including regions 101A, 103A, 105A, and 107A in FIG. 4B), insulating layer 108 is removed by selective etching. Selective etching is straightforward using buffered hydrofluoric acid (BHF) or other solutions of hydrofluoric acid, which etch $SiO_2$ very quickly while affecting Si at a relatively negligible etch rate. Preferably, all silicon oxynitride layers (such as layer 101) are designed to be impervious to BHF or other hydrofluoric acid based etches. After removal of the SiO₂ layer, the entire mesa area of regions 101A, 103A, 105A, and 107A is then passivated with SiO₂ layer 108, which may be deposited by low temperature chemical vapor deposition techniques, atomic layer deposition, or may include growing a thermal oxide on the regions 103A, 105A, and 107A, provided that the ohmic contact metallurgy of contacts 180 and 181 and the interconnects 182 and 183 can withstand the processing temperature.

To further improve the thermal isolation between the mesa structure and substrate 109, the mesa structure is isolated by removal of underlying material, so the only physical connection between the substrate 109 and the mesa occurs through interconnects 182 and 183. Proper design of interconnects 182 and 183 includes making their thermal conductivity as low as possible, which can be achieved by using thin layer stacks with Si3N4 used to provide mechanical support with low thermal conductivity, and using a thin interconnect metallurgy such as TiN to further limit thermal conductivity. Furthermore, interconnects 182 and 183 can incorporate long meander wire structures to further decrease the thermal conductivity to the substrate.

An important aspect of the preferred embodiment is a beveled structure to reduce field-crowding edge-effects. It is well known in the art that high field structures operating in the regime of avalanche breakdown often suffer from edge effects, where fringing fields raise the electrical field strength near the edge of a device, inducing premature breakdown. Beveled mesa termination has been found to be one of the most effective techniques to minimize such edge effects, as is well known in the state of the art. (See *Power Semiconductor Devices* by B. Jayant Baliga, PWS Publishing Company, (1996).) To achieve effective beveled mesa termination in a PIN diode structure requires that p-type doping concentration of layer 103 be sufficiently low that substantial depletion occurs when the diode is biased into the avalanche breakdown regime. In practice, this means that the p-type doping concentration should be low enough that the depletion width into layer 103 should be at least 5% of thickness 155, and preferably in the range of 25-100% of thickness 155. In addition, the mesa side walls must be adequately passivated, as a high density of surface states may reduce the depletion width into region 103A at the mesa side wall, resulting in poor beveled mesa termination. Additionally, the bevel angle 199 of the mesa side wall termination must be large enough. Typically this means that the bevel angle 199 should be larger than 5 degrees from the normal, and preferably in the range of 20-70 degrees. Note that the goal of beveled mesa termination is to make the depletion width into region 103A larger at the mesa surface than in the bulk of the device, because the narrowed depletion width lowers the electric field at the mesa surface and lets the device be dominated by bulk avalanche breakdown effects rather than edge breakdown effects.

Reference is now made to the preferred embodiment of FIG. 4C showing the electrical and thermal feedback elements, including the avalanche transition diode 140 (which includes regions 101A, 103A, 105A, 107A, passivation 108B, and contacts 180 and 181), the negative electrical feedback resistor 141A, and the readout circuit 149. Node 148A lies between resistor 141A and diode 140. The readout circuit 149 provides the voltage bias across connections 183 and 184. During the readout cycle (which may be intermittent or continuous), readout circuit 149 imposes a reverse bias across diode 140 through negative feedback resistor element 141A. The reverse bias across diode 140 creates an internal electric field in diode 140, with the electric field magnitude being large enough to achieve non-negligible impact ionization multiplication in diode 140. The reverse bias is chosen to operate diode 140 in the avalanche transition edge regime, providing an accurate means of measuring the temperature and changes in temperature of diode 140. Negative feedback resistive circuit element 141A provides an electrical feedback loop to stabilize the operating point of diode 140.

Thermal feedback stabilization is also achieved in the preferred embodiment, where heat flow 26C occurs between diode 140 and substrate 184. Heat flow 26C will normally flow through some combination of interconnects 182 and 183, as well as through any additional support members, through gas conduction, and through black-body radiation. Thermal feedback helps to stabilize operation of the diode 140 because operation of diode 140 in the avalanche transition region will result in electrical power dissipation in diode 140, as well as in resistor 141 and interconnects 182, 183, and 183B. Further additional power 22C may be incident on diode 140 (or may be coupled to diode 140 through absorber 21) in the form of electromagnetic energy. If the total incident power on diode 140 (including electrical power dissipation and incident electromagnetic energy 21C) is larger than heat flow 26C, the temperature of diode 140 will increase, shifting the avalanche transition edge and increasing heat flow 26C (note that heat flow 26C is, in general, proportional to the temperature difference between diode 140 and substrate 184). In the preferred embodiment under constant voltage biasing conditions, this shift in the avalanche transition edge results in a reduction in current through diode 140, reducing the electrical power dissipation in diode 140. The net result is a negative electrothermal feedback loop, causing the diode temperature to reach and equilibrium when the heat flow 26C cancels the sum of the electrical power dissipation in diode 140 and the incident electromagnetic energy 21C).

Reference is now made to FIG. 4D showing an alternative electrical biasing circuit in accordance with the invention, including a negative feedback circuit 141, the avalanche transition edge diode 140, and the readout circuit 149. Node 148B lies between negative feedback circuit 141 and diode 140. The readout circuit 149 provides the voltage bias across connections 183 and 184. During the readout cycle (which may be intermittent or continuous), readout circuit imposes a reverse bias across diode 140 through negative feedback element 141. The reverse bias across diode 140 creates an internal electric field in diode 140, with the electric field magnitude being large enough to achieve non-negligible impact ionization multiplication in diode 140. The reverse bias is chosen to operate diode 140 in the avalanche transition edge regime, providing an accurate means of measuring the temperature and changes in temperature of diode 140. Negative feedback circuit 141 provides an electrical feedback loop to stabilize the operating point of diode 140. Negative feedback circuit 141 may incorporate passive circuit elements including resistors capacitors, and inductors, and active circuit elements including diodes, transistors, and other circuit elements.

Reference is now made to FIG. 4E showing an alternative electrical biasing circuit in accordance with the invention, including a negative feedback resistor 141B, a negative feedback capacitor 141C, the avalanche transition edge diode 140, and the readout circuit 149. The negative feedback capacitor 141C provides a high frequency path across resistor 141B, enabling a faster response of the voltage at node 148B, and therefore more rapid compensation of the avalanche gain and further suppression of avalanche gain noise.

Reference is now made to FIG. 4F showing another alternative electrical biasing circuit in accordance with the invention, including only the avalanche transition edge diode 140, and the readout circuit 149. In this case, readout circuit 149 can provide the required electrical feedback to stabilize the operation of diode 140. This can be achieved by providing a means of current limiting in readout circuit 149, or by operating readout circuit 149 in a constant current mode of operation, or by operating readout circuit 149 in a pulse biasing mode with a fast enough pulse width to ensure that the total current through diode 140 is limited, or providing an active feedback loop whereby the voltage bias from circuit 149 is adjusted depending on the current drawn by diode 140 in order to maintain stable operation.

Reference is now made to FIG. 5A, which shows the calculated gain as a function of bias for the silicon-on-insulator PIN diode structure shown in FIG. 4A at a lattice temperature of 290 K, using a idealized one-dimensional model of avalanche breakdown (See S. M. Sze, *Physics of Semiconductor Devices*, pp. 99-108, John Wiley & Sons, Inc. (1981).) and using the temperature dependence of the impact ionization coefficients in silicon from D. J. Massey, J. P. R. David, and G. J. Rees, "Temperature Dependence of Impact Ionization in Submicrometer Silicon Devices," *IEEE Trans. Electron. Dev.* 53(9) pp. 2328-2334 (2006). This idealized one-dimensional model assumes the depletion approximation, and furthermore assumes that the depletion region thickness is held constant at 1.25 µm irrespective of the reverse bias, which is not accurate at low reverse bias (where the depletion region thickness approaches 0.75 µm). Furthermore, this one-dimensional model does not take into account any of the surface effects such as the surface state density, surface depletion, etc. For a properly designed beveled edge mesa structure, this one-dimensional model can provide a reasonably accurate model of the operation of the device in the avalanche breakdown regime. Axis 202 is the calculated avalanche multiplication gain, using a logarithmic scale running from a minimum gain of 1 to a maximum gain of $10^7$. Axis 201 is the bias voltage applied to the diode, ranging from −50 Volts to 0 Volts, where the negative sign represents reverse biasing conditions. Curve 211 is the calculated avalanche multiplication gain of diode 140 at an operating temperature of 290K using the idealized one-dimensional model. Region 221 of curve 211 is the avalanche breakdown transition edge, where the avalanche current increases rapidly as a function of voltage bias. Region 222 of curve 211 is the region of avalanche gain normally used for linear mode avalanche photodiodes. Region 223 of curve 211 is the region of unity gain, where the avalanche multiplication gain is approximately 1.0 and impact ionization is negligible.

Figure 5B:
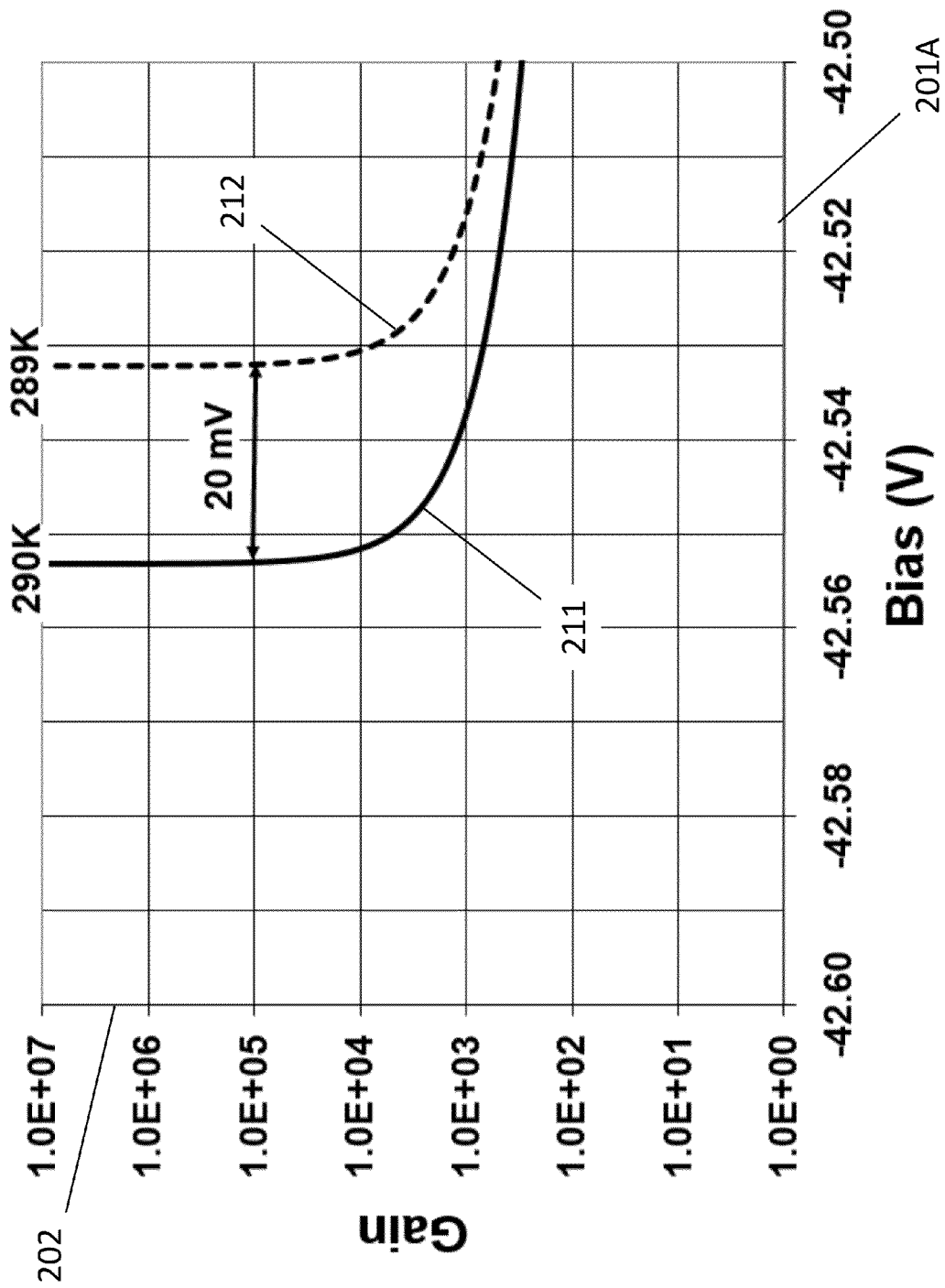
FIG. 5B shows the calculated current-voltage (I-V) curves for the diode structure of FIG. 4A when operated at 290K and the calculated current-voltage (I-V) curve for the same diode when operated at 289K.

Reference is now made to FIG. 5B, which shows a detail of the gain characteristics in the avalanche transition edge region. The point is that a graph like this, or an algebraic representation of one like this, allows a precise measurement across the diode junction to be converted into a precise statement of temperature; and similarly for a change in temperature or offset in temperature. Axis 201A shows the reverse bias voltage running between −42.6 Volts and −42.5 Volts, where the negative voltage denotes a reverse bias. Curve 211 is the calculated avalanche multiplication gain of diode 140 at an operating temperature of 290 K using the idealized one-dimensional model. Curve 212 is the calculated avalanche multiplication gain of diode 140 at an operating temperature of 289 K. The calculation shows an approximately 20 mV per kelvin shift of the breakdown voltage for diode 140 when operated near 290 kelvins.

Figure 5C:
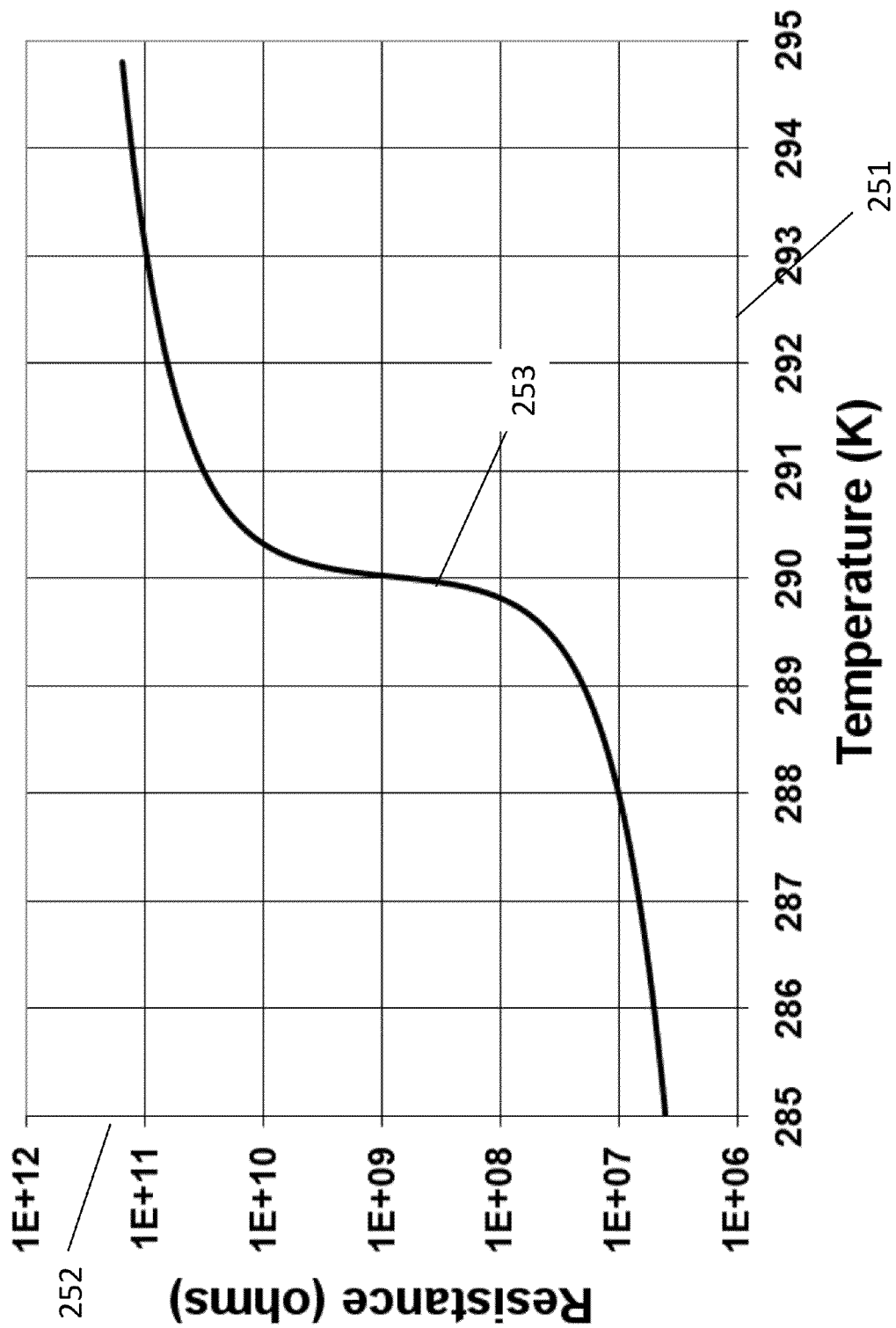
FIG. 5C shows the calculated resistance as a function of temperature for a diode operated at a constant bias of 42.5535 V.

Reference is now made to FIG. 5C, which shows the resistance of diode 140 as a function of temperature calculated using the idealized one-dimensional model. Axis 252 is the resistance in ohms, on a log scale running from a $10^6$ ohms to $10^{12}$ ohms. Axis 251 is the temperature of diode 140 in kelvins, ranging from 285 K to 295 K on a linear scale. The idealized model assumed an incident dark current of 1 pA, a bias voltage of 42.5535 V, and a series resistor 141A with a resistance of 10 kΩ. The model used an iterative solver to determine the gain, device current (calculated as the gain multiplied by 1 pA), and the voltage drop across series resistor 141A (calculated as 10 kΩ multiplied by the device current). Curve 253 is the calculated resistance of diode 140 as a function of temperature. The avalanche transition edge is seen to occur near 290 K, with the device resistance increasing by three orders of magnitude as the device temperature is increased from 289 K to 291 K.

Figure 5D:
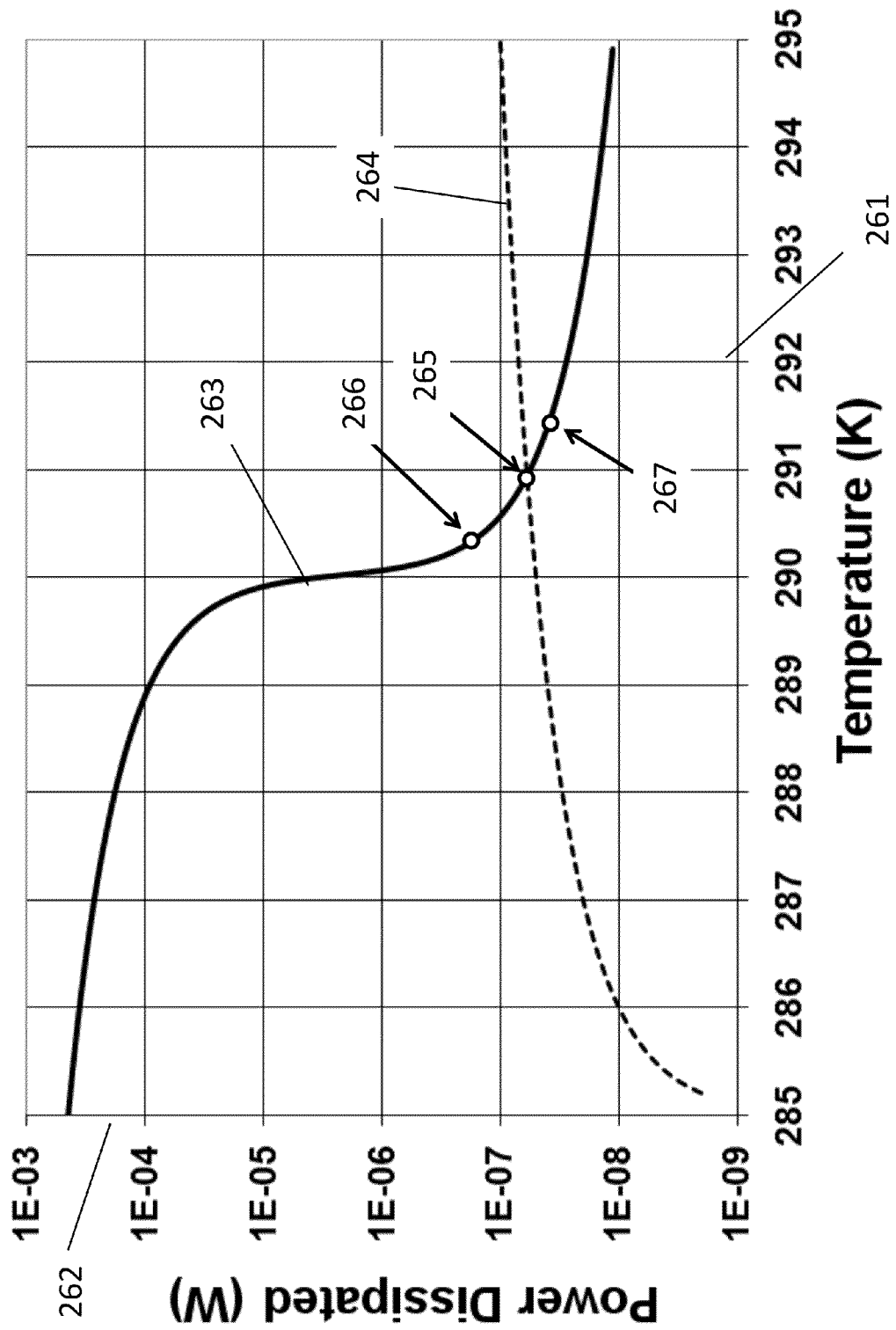
FIG. 5D shows the calculated power dissipation as a function of temperature for a diode operated at a constant bias of 42.5535 V.

Reference is now made to FIG. 5D which shows the power dissipated by diode 140 as a function of temperature calculated using the idealized one-dimensional model. Axis 262 is the power dissipation in Watts, on a log scale running from a 10 nW to 1 mW. Axis 261 is the temperature of diode 140 in kelvins, ranging from 285 K to 295 K on a linear scale. The idealized model assumed an incident dark current of 1 pA, a bias voltage of 42.5535 V, and a series resistor 141A with a resistance of 10 kΩ. The model used an iterative solver to determine the gain, device current (calculated as the gain multiplied by 1 pA), and the voltage drop across series resistor 141A (calculated as 10 kΩ multiplied by the device current). Curve 263 is the calculated power dissipation in diode 140 as a function of temperature. The avalanche transition edge is seen to occur near 290 K, with the device power dissipation decreasing by more than three orders of magnitude as the device temperature increased from 289 K to 291K. Curve 264 is the load line of the power dissipated through the thermal link to substrate 184, where the temperature of substrate 184 is assumed to be 285 K, and the thermal conductivity of the thermal link between diode 140 and substrate 184 is G=10 nW/K. Operating point 265 is the equilibrium operating point where the power dissipated to the substrate 184 matches the power dissipated in diode 184, assuming there is no other source of power incident on diode 140.

It is straightforward to determine that operating point 265 is in equilibrium. If a perturbation were to change diode 140 to a slightly lower temperature such that the power dissipation shifts to operating point 266, then diode 140 power would be substantially larger than the power lost to substrate 184 through the thermal link with conductivity G. This increase in diode 140 power dissipation at operating point 266 would cause diode 140 temperature to increase until the diode 140 power dissipation matched the power lost to substrate 184 at equilibrium operating point 265. Similarly, if a perturbation were to change diode 140 to a slightly higher temperature such that the power dissipation shifted to operating point 267, then diode 140 power would be less than the power lost to substrate 184 through the link with thermal conductivity G. This decrease in diode 140 power dissipation at operating point 267 would cause the temperature of diode 140 to decrease until the power dissipation from diode 140 matched the power lost to substrate 184 at equilibrium operating point 265. The steep slope of curve 263 near operating point 265 provides a strong negative feedback mechanism to keep the operating temperature of diode 140 constant.

This analysis assumes that substrate 184 temperature is held constant at 285 K. In a practical application, it may not be possible to maintain substrate 184 temperature to a constant. Using the load line analysis of FIG. 6D, we find the equilibrium operating point has a sensitivity to substrate temperature variations of about 8.7 nW/K. Because the calculation assumes a thermal conductivity between diode 140 and substrate 184 of 10 nW/K, the effect of this negative electrothermal feedback loop results in an effective gain of 0.87, which means that the temperature change of diode 140 will be 87% of the change in temperature of substrate 184.

Figure 6A:
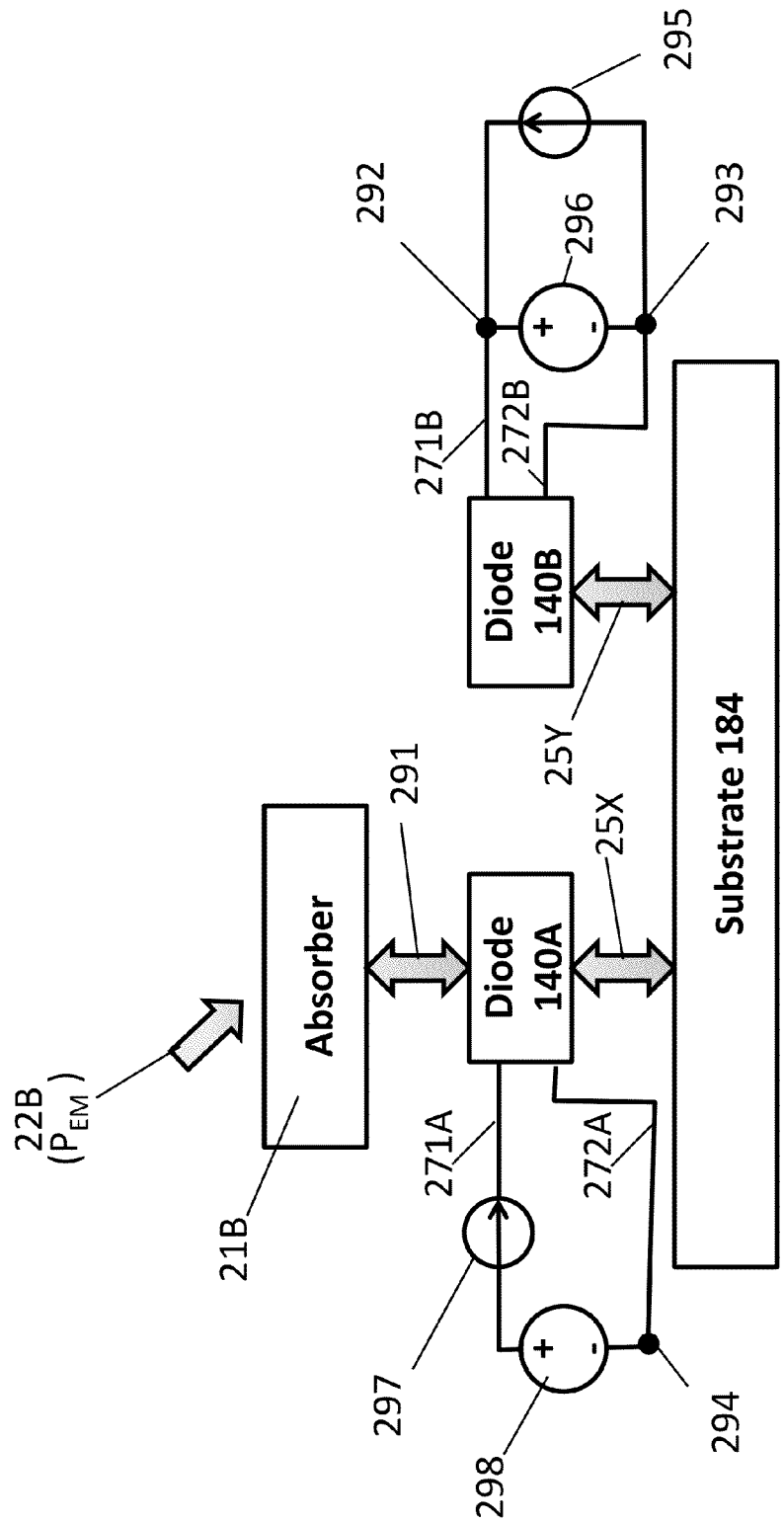
FIG. 6A shows a microbolometer circuit incorporating a reference diode in accordance with the invention.

Reference is now made to FIG. 6A which shows a means of maintaining a constant temperature offset between an avalanche transition edge temperature diode and a substrate. Diode 140B is used to provide an estimate of the substrate temperature by operating in the avalanche transition region. Diode 140B has a thermal conductivity 25Y to substrate 184. For the case where an accurate measurement of the substrate temperature is required, thermal conductivity 25Y should be high to minimize the temperature offset between diode 140B and substrate 184. Current 295 is forced into the anode connection 271B of diode 140B, causing the diode to be biased into the avalanche transition edge regime of operation. A voltmeter 296 is connected across nodes 292 and 293, where node 292 connects to the cathode 271B of diode 140B, while node 293 connects to the anode 272B of diode 140B. Under the operating condition of constant current 295, the voltage measured by voltmeter 296 provides a precision measurement of substrate temperature 184. Additionally, the voltage at voltmeter 296 and the current 295 together define an operating point for diode when the diode 140B temperature is equal to the substrate 184 temperature if thermal link 25Y exhibits a high enough thermal conductivity to keep the temperature of diode 140B equal to that of substrate 184. In other words, thermal link 25Y provides a thermal short to substrate 184. The power dissipated by diode 140B is constant provide substrate 184 temperature is constant. If the temperature of substrate 184 varies, the power dissipation of diode 140B will exhibit a small variation. For example, for the calculated ideal diode curve shown in FIG. 5B, the voltage is 42.55 V+(20 mV/K)×($\Delta$T), where $\Delta$T=T−290 K, and T is the temperature of diode 140B. Therefore, for $\Delta$T=1 kelvin, the diode voltage shifts by 20 mV, and the power dissipated in the diode shifts by 0.047% (tracking the bias voltage on diode 140B with the current on diode 140B remaining constant).

The voltage measured by voltmeter 296 is used to provide a bias voltage 298 to diode 140A. Bias voltage 298 is applied across the cathode contact 271A to diode 140A and the anode contact 272A to diode 140A. In general, the bias voltage 298 may be offset from the voltage measured by voltmeter 296 if desired. In one embodiment, bias voltage 298 is set to be equal to the voltage measured by voltmeter 296, which will cause the initial power dissipation in diode 140A to be approximately equal to the power dissipation in diode 140B when the temperature of diode 140B equals the temperature of diode 140A. The power dissipation in diode 140A will cause the temperature of diode 140A to increase, particularly in the case where the thermal link 25X between diode 140A and substrate 184 exhibits a low thermal conductivity, such as nW/K≤G<1000 nW/K. Diode 140A will then be operating in a negative electrothermal feedback loop and will find an equilibrium power dissipation where the electrical power dissipated into diode 140A matches the power out of diode 140A through thermal link 25X. The temperature of diode 140A will then be stabilized to a fixed offset from the substrate 184 temperature. Any increase in substrate 184 temperature will cause the voltage of diode 140B to shift, which will shift the voltage applied to diode 140A, thereby maintaining the temperature offset. For example, for the calculated ideal diode curve shown in FIG. 5B, an increase in substrate temperature of 1K results in an increase in the breakdown voltage of about 20 mV. Therefore, if diodes 140A and 140B follow the ideal diode curve shown in FIG. 5B, the voltage measured by voltmeter 296 will increase by 20 mV for every 1 kelvin increase in substrate temperature, causing the voltage forced by voltage supply 298 to increase by 20 mV, and thereby causing the equilibrium point on the electrothermal feedback loop to shift to maintain the constant temperature offset between diode 140A and substrate 184.

Diode 140A is the temperature sensing device of a microbolometer pixel, where the microbolometer pixel consists of absorber 21B, thermal link 291 between absorber 21B and diode 140A, diode 140A, and thermal link 25X. The negative electrothermal feedback loop incorporating diode 140A and thermal link 25X acts to maintain a constant temperature offset between diode 140A and substrate 184. In the absence of electromagnetic radiation 22B, diode temperature 140A is maintained solely by the electrical power dissipation in diode 140A, which is approximately equal to the voltage applied by voltage source 298 and the current measured at current meter 297. For the case of non-zero electromagnetic radiation 22B, the negative electrothermal feedback loop causes the current measured at current meter 297 to decrease in order to maintain the temperature of diode 140A and to maintain a constant heat flux through thermal link 25X. This means that the current measured at current meter 297 is inversely related to the electromagnetic power 22B, where a differential increase in electromagnetic power 22B causes a proportional decrease in the current measured at current meter 297. Therefore, the microbolometer pixel readily measures changes in the incident electromagnetic power 22B, and an array of such microbolmeter pixels can readily measure differences in the incident electromagnetic power. Furthermore, with proper calibration, such microbolometers can be used to provide accurate estimates of the total incident electromagnetic power 22B. Calibration is readily achieved by forcing the incident electromagnetic power 22B to be negligible (for example by imaging a very cold black body source), or by forcing the electromagnetic power 22B to be a known quantity (for example, by imaging a calibrated black body).

In an alternative embodiment, the thermal conductivity G of thermal links 25X and 25Y can be set to be approximately equal and to exhibit low thermal conductivity, for example in the range of 1 nW/K to 1000 nW/K. In this embodiment, the thermal power dissipated in diode 140B will cause the temperature of diode 140B to increase relative to the temperature of substrate 184. By setting current 295 and measuring the voltage with voltmeter 296, the power dissipation in diode 140B is the product of said voltage and current. We then set the voltage 298 to be equal to the voltage measured with voltmeter 296. Since diode 140B does not have an absorber, current 295 is approximately the same as the current expected through current meter 297 for the case where the incident electromagnetic energy 22B is zero. This provides a means of self calibrating the microbolometer the difference in the current 295 forced through diode 140B and the current measured at current meter 297 provides a direct measure of the incident electromagnetic energy 22B, where the incident electromagnetic flux is calculated as power by multiplying the voltage 298 by the difference between current 295 and the current measured at current meter 297. This teaches a very simple readout circuit using a differential current amplifier to measure the current difference between diode 140A and 140B. Similarly, a differential voltage amplifier may be used if said currents are converted to a voltage by using matched and calibrated termination resistors. Those skilled in the art will recognize that a wide range of readout circuitry may be used, including differential amplifiers, transimpedance amplifiers, differential transimpedance amplifiers, integrating amplifiers, and other amplifier circuits well known in the state of the art.

Additionally, the embodiment shown in FIG. 6A can be used to provide an automatic gain control to optimize dynamic range. For the highest sensitivity applications, where the incident electromagnetic power is low and exhibits low contrast, it is desirable to set current 295 to the minimum possible value. The minimum possible value of current 295 is determined by the maximum incident electromagnetic power, since at the point where the incident electromagnetic energy 22B equals the product of current 295 and bias voltage 298 (for the case where thermal conductivities 25X and 25Y are equal). At this maximum incident electromagnetic power, the power dissipated through diode 140A drops to near zero, and the negative electrothermal feedback loop can no longer maintain the temperature offset between diode 140A and substrate 184. The dynamic range of a microbolometer pixel is maximized by setting the minimum possible value of current 295, particularly when the readout circuit employs a differential amplifier to amplify the difference in the currents through diode 140A and 140B. Automatic gain control can be employed to maintain a safe operating margin on current 295, increasing current 295 for the case where the incident electromagnetic power increases, and decreasing current 295 for the case where the incident electromagnetic power decreases.

We note here that FIG. 6A illustrates a specific case of a single microbolometer pixel with avalanche edge temperature sensing diode 140A and a single temperature reference avalanche edge temperature sensing diode 140B. Those skilled in the art will recognize that arrays of microbolometer pixels can be used for imaging applications, so arrays consisting of pairs of microbolometer pixels and temperature reference diodes can readily be formed for imaging applications. Furthermore, for some applications, it may be desirable to use a single reference avalanche edge temperature sensing diode for a multiplicity of microbolometer pixels in order to reduce the number of reference avalanche edge temperature sensing diodes.

Figure 6B:
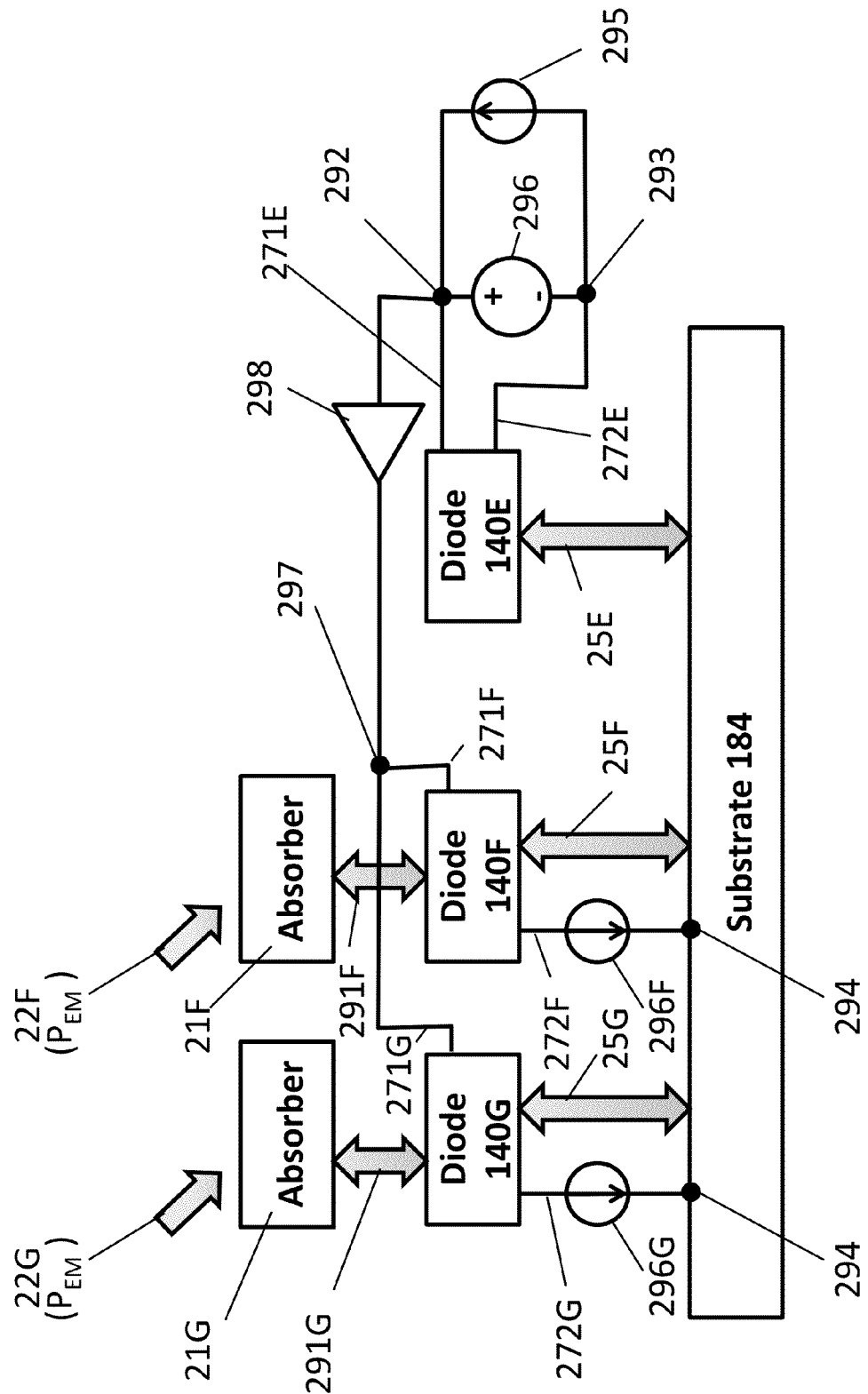
FIG. 6B shows an alternative microbolometer circuit incorporating a reference diode in accordance with the invention.

Reference is now made to FIG. 6B, which shows another embodiment of the invention that can be used to maintain a constant offset temperature between a substrate and a diode. Diode 140E is the reference diode, which has a thermal link 25E to substrate 184. FIG. 6B illustrates two microbolometer pixels, though those skilled in the art will recognize that adding additional microblometer pixels can readily be achieved to obtain the desired resolution in an imaging array. The first microbolometer pixel consists of absorber 21F with thermal link 291F to diode 140F, diode 140F with thermal link 25F to substrate 184, cathode connection 271F to diode 140F, and anode connection 272F to diode 140F. The second microbolometer pixel consists of absorber 21G with thermal link 291G to diode 140G, diode 140G with thermal link 25G to substrate 184, cathode connection 271G to diode 140G, and anode connection 272G to diode 140G. Diode 140E is the reference diode to be used to maintain the constant offset temperature between substrate 184 and diode 140E. Diode 140E is driven with a constant current source 295, which forces a current into cathode 271E of diode 140E. The reverse bias current through current source 295 causes diode 140E to operate in the avalanche transition edge. An equilibrium voltage across cathode connection 271E and anode connection 272E of diode 140E is reached when the electrical power dissipated in diode 140E equilibrates with the thermal power lost to the substrate through thermal link 25E. This equilibrium voltage at cathode connection 271E and node 292 is used to drive voltage buffer 298. voltage buffer 298 provides the biasing voltage for cathode connections 271F and 271G of diodes 140F and 140G respectively. In one embodiment, nodes 293 and 294 are tied together so that that the bias voltage across diodes 140E, 140F and 140G are approximately equivalent. The negative electrothermal feedback loops of diodes 140F and 140G will servo their temperature to the temperature of diode 140E. For the case where the thermal conductivity of links 25E, 25F, and 25G are equal, the temperature of diodes 140E, 140F, and 140G will be equal. This provides a means of providing an approximately constant offset temperature with respect to the substrate temperature, because the power dissipated through diode 140E is approximately constant and the thermal conductivity of link 25E is approximately constant. In addition, the electrical power dissipated through diode 140E can be used as a calibration reference power, which will be approximately equal to the electrical power dissipated through diodes 140F and 140G for the case of negligible incident electromagnetic powers 22F and 22G. When the incident electromagnetic powers 22F is non-negligible, the difference in the electrical power dissipated by diode 140F and 140E is approximately equal to the electromagnetic power 22F absorbed in absorber 21F. Similarly, when the incident electromagnetic powers 22G is non negligible, the difference in the electrical power dissipated by diode 140G and 140E is approximately equal to the electromagnetic power 22G absorbed in absorber 21G.

Negative electrothermal feedback is well known in the prior art, though prior art implementations of negative electrothermal feedback resulted in operation of microbolometers at a fixed absolute temperature, which is a direct result of the temperature of the transition edge being fixed by a phase change or state change that occurs at an absolute temperature. The present invention exploits the avalanche transition edge, which is generally available at any temperature. The bias position of the avalanche transition edge varies as a function of temperature, so there is a one-to-one relationship between the diode operating point (voltage bias and output current) in the avalanche transition edge and the absolute temperature. The present invention uses negative electrothermal feedback and the avalanche transition edge to operate a microbolometer pixel at a fixed offset temperature relative to the substrate. This is a critical distinction, because it allows the present invention to be used at nearly any substrate temperature. Furthermore, because the invention uses a relative offset temperature, either the substrate temperature must be accurately fixed (which may be hard to do in practice), or a reference diode must be used (as shown in FIG. 6).

The present invention makes use of an important feature of negative electrothermal feedback that is well described in the prior art but never applied to this problem. The temperature stabilization effects of negative electrothermal feedback enable microbolometers to operate at an effective thermal time constant that is faster than the intrinsic thermal time constant given by $\tau=C/G$. A negative electrothermal feedback circuit is a thermal analogy to an electrical transimpedance amplifier circuit, giving an effective faster thermal response while maintaining a high thermal resistance (i.e. ultra-low thermal conductivity) in the way that a transimpedance amplifier gives a fast electrical response while maintaining a high transimpedance resistance. A transimpedance amplifier requires an electrical feedback circuit with a gain element, and so does an electrothermal feedback circuit.

Any electrothermal feedback circuit can be used to change the effective thermal conductivity of a microbolometer pixel (see: M. Galeazzi, and D. McCammon, "Microcalorimeter and bolometer model," *J. Appl. Phys.*, 93(8) pp. 4856-4869 (2003) and M. Galeazzi, "An external electronic feedback system applied to a cryogenic μ-calorimeter," *Rev. Scientific Instrum.*, 69(5) pp. 2017-2023 (1998).):

$$G_{ETH} = -\alpha P(R_L - R)/(R_L + R) \quad \text{(equation 2)}$$

$$\alpha = 1/R \times dR/dT \quad \text{(equation 3)}$$

$$G_{eff} = G + G_{ETH} \quad \text{(equation 4)}$$

$$\tau = C/G \quad \text{(equation 5)}$$

$$\tau_{eff} = C/G_{eff} \quad \text{(equation 6)}$$

where
- $\alpha$ is the thermal coefficient of resistance (%/K)
- G is the thermal conductivity of the bolometer (W/K)
- $G_{ETH}$ is the effective electrothermal feedback thermal conductivity (W/K)
- $P = I \times V$ is the power dissipated in the electrothermal feedback loop (W)
- R is the resistance of the sensor
- $R_L$ is the load resistance on the readout circuit
- $G_{eff}$ is the effective thermal conductivity when operated with electrothermal feedback (W/K)
- $\tau$ is the thermal time constant of a microbolometer
- $\tau_{eff}$ is the effective time constant when operated with electrothermal feedback With proper design, an electrothermal feedback loop can be used to provide an effective thermal time constant that is 10-1000 times faster than the intrinsic thermal time constant. This is an important consideration for microbolometers, because optimal sensitivity is achieved only when the thermal isolation to the substrate is large (ultra-low G), which would make the intrinsic thermal time constant excessively long in the absence of negative electrothermal feedback. In many applications it is a requirement to have short thermal time constants, so an electrothermal feedback loop can be used simultaneously to achieve a short effective thermal time constant, and an ultra-low G to achieve the highest possible sensitivity.

An alternative embodiment of the invention using GaAs diodes operated in the avalanche transition edge is shown in FIG. 7. Reference is now made to FIG. 7A, showing the layer structure of the GaAs diode. The structure incorporates a p-$Al_{0.3}Ga_{0.3}As$ top contacting layer 301, a p-GaAs layer 303, an i-GaAs layer 305, an n-GaAs layer 307, an n-AlGaAs layer 308, and a thermal isolation layer 309 on a n-GaAs substrate 310. The p-$Al_{0.3}Ga_{0.3}As$ layer 301 is used to minimize thermal generation at the top surface of the device and the n-$Al_{0.3}Ga_{0.3}As$ layer 308 is used to block thermally generated carriers in the underlying layers from reaching the active layers of the device. Thermal generation of minority carriers causes a dark current to flow through the device. The thickness of layer 301 is 351, the thickness of layer 303 is 353, the thickness of layer 305 is 355, the thickness of layer 307 is 357, the thickness of layer 308 is 358 and the thickness of layer 309 is 359. In a typical realization of this alternative embodiment of the invention:

- layer 301 is doped $5 \times 10^{18}$ $cm^{-3}$ and thickness 351 is 100 nm
- layer 303 is doped $1 \times 10^{17}$ $cm^{-3}$ and thickness 353 is 100 nm
- layer 305 is nominally undoped and thickness 355 is 1000 nm
- layer 307 is doped $5 \times 10^{17}$ $cm^{-3}$ and thickness 357 is 100 nm
- layer 308 is doped $5 \times 10^{17}$ $cm^{-3}$ and thickness 358 is 100 nm
- layer 309 consists of an undoped $Al_{0.9}Ga_{0.1}As$ layer and thickness 359 of 1000 nm.

Figure 7A:
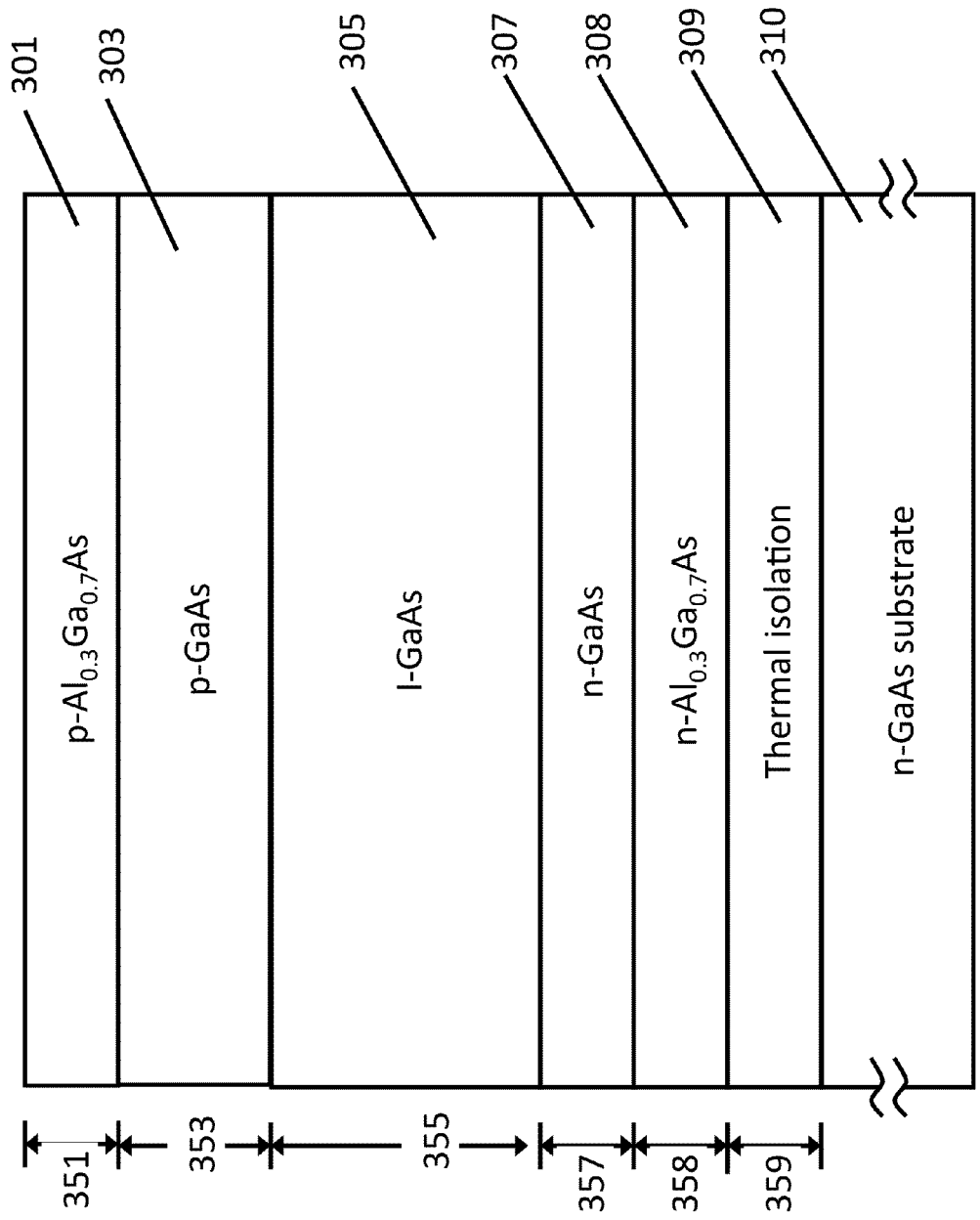
FIG. 7A shows an epitaxial layer stack in accordance with the invention.
Figure 7B:
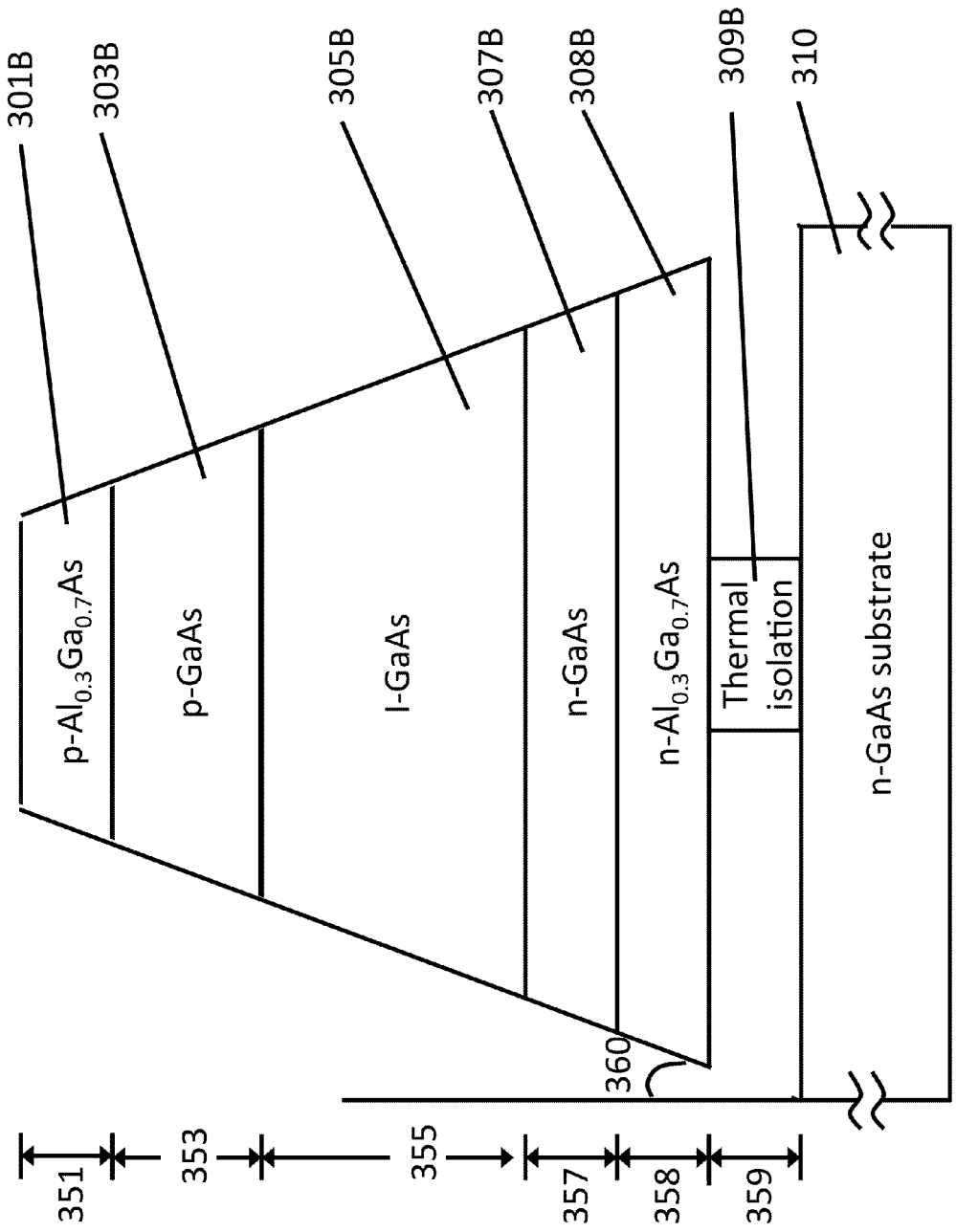
FIG. 7B show how a thermally isolated diode can be fabricated from the layer stack of FIG. 7A.

Reference is now made to FIG. 7B, which shows how the layer structure of FIG. 7A can be fabricated into a diode in accordance with the invention. Masking and wet chemical etching may be used to define regions 301B, 303B, 305B, 307B, 308B and 309B as shown in the Figure. To provide good thermal isolation, layer 309 can be oxidized in wet $O_2$ to convert the layer to $Al_2O_3$, or it can be selectively etched (as shown in FIG. 7B) to provide a very small cross sectional area. Selective etching can be achieved using dilute HF solutions with very high selectivity with fast etching of layer 309 and negligible etching of substrate 310 as well as negligible etching of regions 301B, 303B, 305B, 307B and 308B.

Figure 7C:
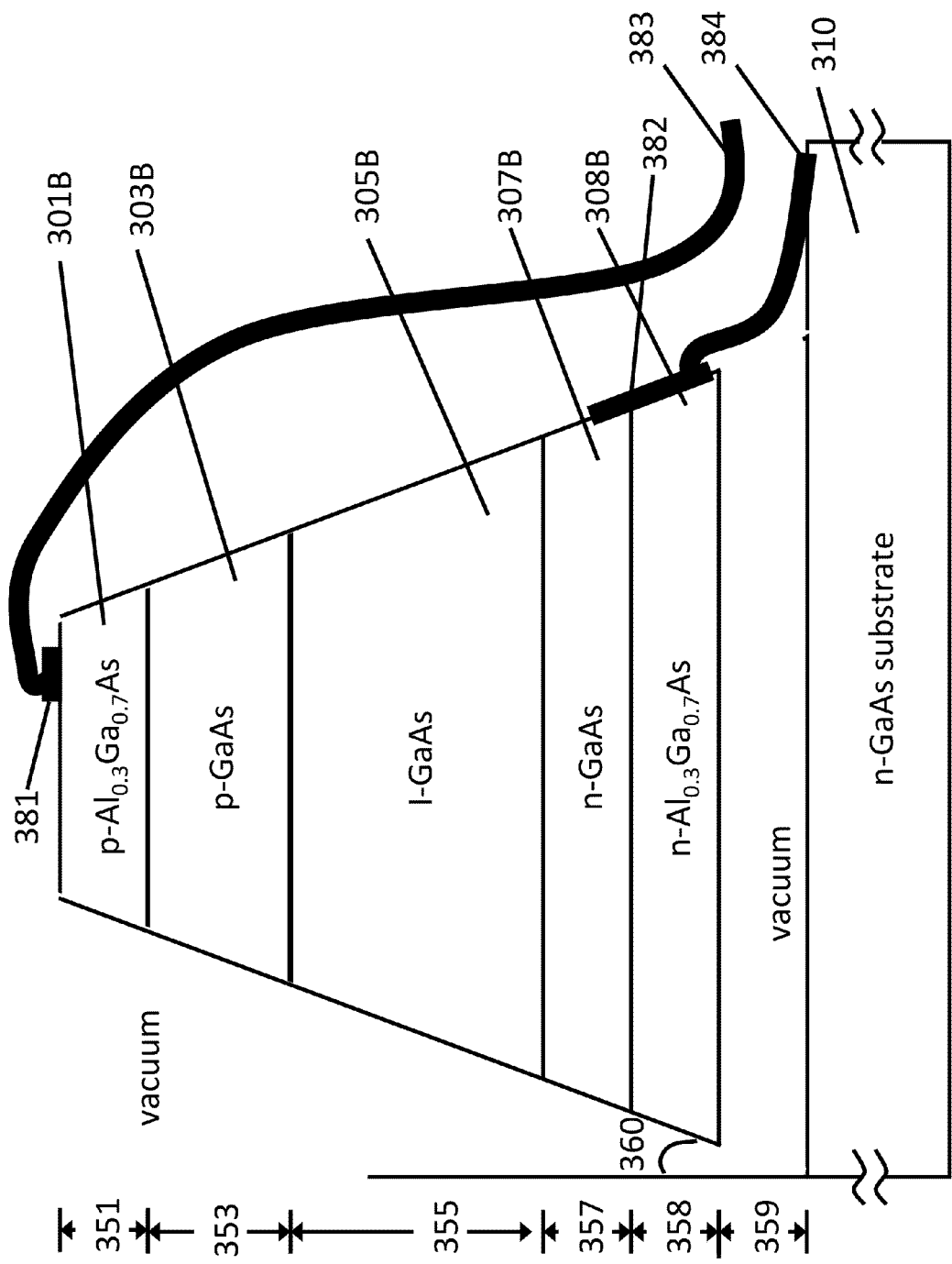
FIG. 7C shows how an alternative thermally isolated diode can be fabricated from the layer stack of FIG. 7A.

Reference is now made to FIG. 7C, which shows an alternative means of thermally isolating the device would be to deposit support legs with a low thermal conductivity between the substrate and regions 301B, 303B, 305B, 307B and/or 308B, and completely remove layer 309 resulting in suspension of the active device above the substrate (in air or in a vacuum) as shown in FIG. 7C.

Electrical contacts can be made to layers 303 and 307 using techniques well-known in the state of the art, typically using alloyed metal contacts. To minimize thermal conductivity through the contacts, the contacts should employ "air bridges", and thin metal layers. To further reduce the thermal conductivity, the structure should be operated in a vacuum.

The angle of the mesa side wall 360 should be chosen to minimize electrical field crowding at the edges of the mesa as is well-known in the state of the art. The mesa side walls should be properly passivated, using techniques well-known in the state of the art, such as $(NH_4)_2S$ passivation followed by deposition of a high quality dielectric. The high quality dielectric is preferably deposited using atomic layer deposition (ALD) at low temperature (below 300 C). A good choice of passivating dielectric is $Al_2O_3$. There are many alternative mesa side wall passivation techniques well-known in the state of the art, including using polyimide or BCB as the passivating layer, or using PECVD-deposited $SiO_2$ or $Si_3N_4$.

Figure 7D:
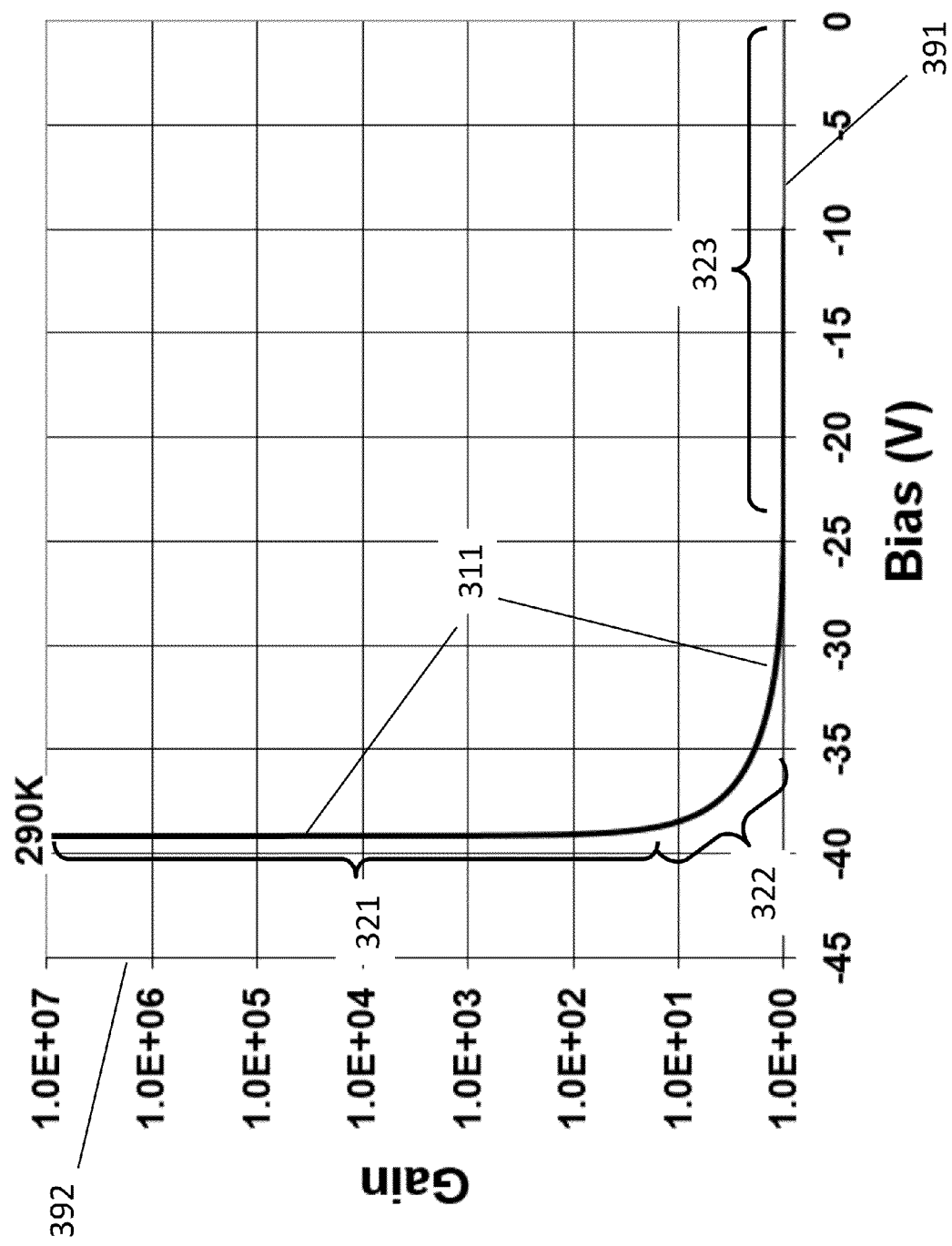
FIG. 7D shows the calculated current-voltage (I-V) curve of the diode structure of FIG. 7A when operated at 290 K.

Reference is now made to FIG. 7D, which shows the calculated gain as a function of bias for the GaAs diode structure shown in FIG. 7A at a lattice temperature of 290 K, using a idealized one-dimensional model of avalanche breakdown (See S. M. Sze, Physics of Semiconductor Devices, Pp. 99-108, John Wiley & Sons, Inc. 1981.) and using the temperature dependence of the impact ionization coefficients in GaAs from G. Groves, R. Ghin, J. P. R. David, and G. J. Rees, "Temperature Dependence of Impact Ionization in GaAs," *IEEE Trans. Electron Dev.* 50(10), pp 2027-2031 (2003). This idealized one-dimensional model assumes the depletion approximation, and further assumes that the depletion region thickness is held constant at 1.25 μm irrespective of the reverse bias, which is not accurate at low reverse bias (where the depletion region thickness approaches 1.0 μm). Furthermore, this one-dimensional model does not take into account any of the surface effects such as the surface state density, surface depletion, etc. For a properly designed beveled edge mesa structure, this one-dimensional model can nevertheless provide a reasonably accurate model of the operation of the device in the avalanche breakdown regime. Axis 392 is the calculated avalanche multiplication gain, using a logarithmic scale running from a minimum gain of $10^0$ to a maximum gain of $10^7$. Axis 391 is the bias voltage applied to the diode, ranging from −50 Volts to 0 V, where the negative sign represents reverse biasing conditions.

Curve 311 is the calculated avalanche multiplication gain of the GaAs diode at an operating temperature of 290K using the idealized one-dimensional model. Region 321 of curve 311 is the avalanche breakdown transition edge, where the avalanche current increases rapidly as a function of voltage bias. Region 322 of curve 311 is the region of avalanche gain normally used for linear mode avalanche photodiodes. Region 323 of curve 311 is the region of unity gain, where the avalanche multiplication gain is approximately 1.0 and impact ionization is negligible.

Figure 7E:
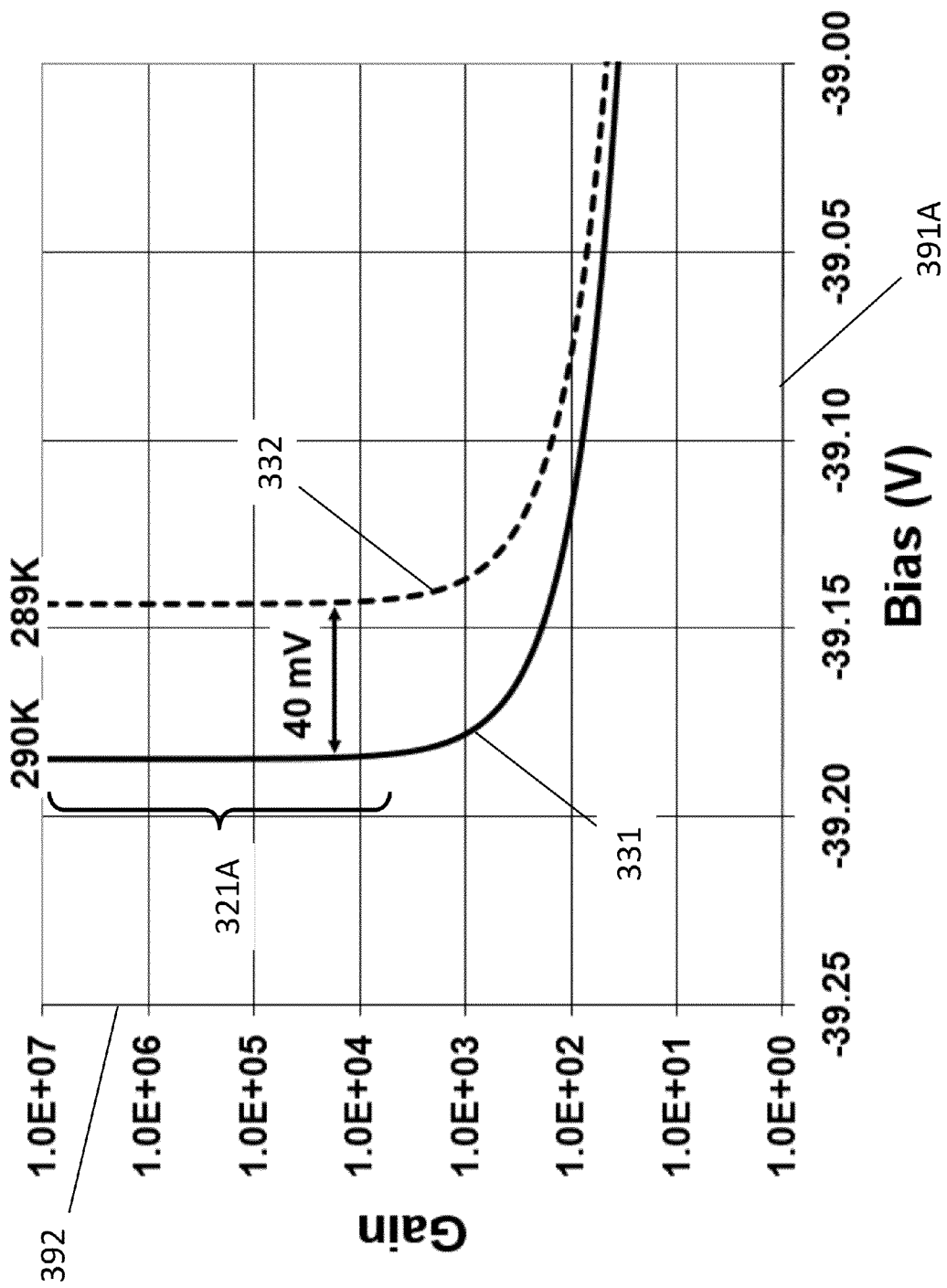
FIG. 7E shows the calculated current-voltage (I-V) curves for the diode structure of FIG. 7A when operated at 290 K and the calculated current-voltage (I-V) curve for the same diode when operated at 289 K.

Reference is now made to FIG. 7E, which shows the detail of the gain characteristics in the avalanche transition edge region for the GaAs diode of FIG. 7A. Axis 391A shows the reverse bias voltage running between −42.6 V and −42.5 V, where the negative voltage denotes a reverse bias. Curve 311 is the calculated avalanche multiplication gain of the GaAs diode at an operating temperature of 290 K using the idealized one-dimensional model. Curve 312 is the calculated avalanche multiplication gain of the GaAs diode at an operating temperature of 289 K. The calculation shows an approximately 40 mV/K shift of the breakdown voltage for the idealized GaAs diode when operated near 290 K.

Figure 8A:
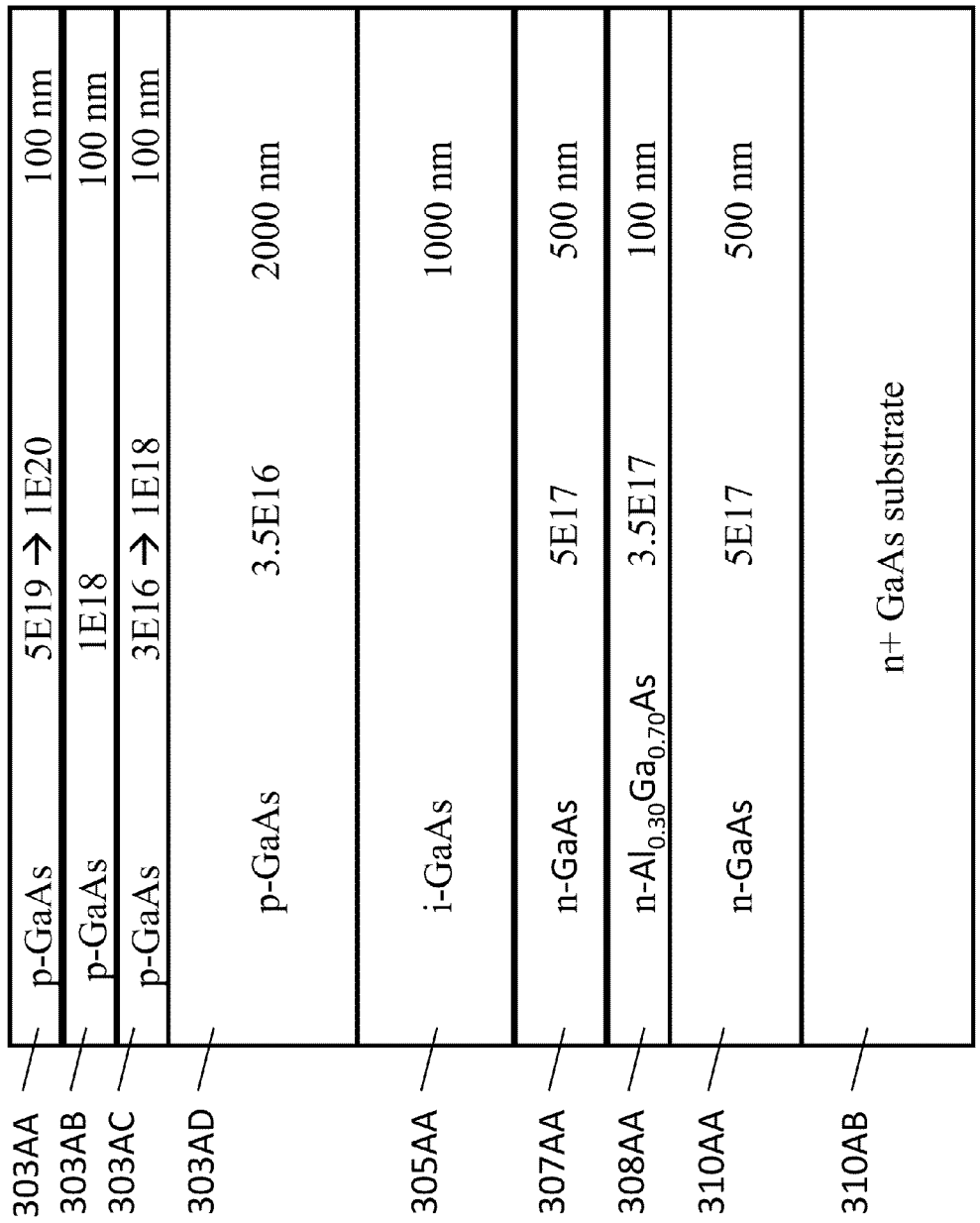
FIG. 8A shows an epitaxial layer structure in accordance with the invention.

Reference is now made to FIG. 8A, showing the design of a layer structure for a GaAs avalanche transition edge temperature sensor. Metal-organic chemical vapor deposition (MOCVD) was use to grow the layer structure on an n-GaAs substrate 310AB. A GaAs buffer layer 310AA was grown directly on top of substrate 310AB. GaAs buffer layer 301AA was doped n-type with silicon to a doping density of $5\times10^{17}$ cm$^{-3}$ and grown to a thickness of 500 nm. $Al_{0.3}Ga_{0.7}As$ heterojunction barrier layer 308AA was grown on top of buffer layer 310AA. $Al_{0.3}Ga_{0.7}As$ Layer 308AA was doped n-type with silicon to a doping density of $3.5\times10^{17}$ cm$^{-3}$ and grown to a thickness of 100 nm. GaAs layer 307AA was grown on top of layer 308AA. GaAs layer 307AA was doped n-type with silicon to a doping density of $5\times10^{17}$ cm$^{-3}$ and grown to a thickness of 500 nm. GaAs layer 305AA was grown on top of layer 307AA. GaAs layer 305AA was nominally undoped and grown to a thickness of 1000 nm. GaAs layer 303AD was grown on top of layer 305AA. GaAs layer 303AD was doped p-type with zinc to a doping density of $3.5\times10^{16}$ cm$^{-3}$ and grown to a thickness of 2000 nm. GaAs layer 303AC was grown on top of layer 303AD. GaAs layer 303AC was doped p-type with zinc to a doping density varied linearly from $3.5\times10^{17}$ cm$^{-3}$ at the interface to layer 303AD to $1\times10^{18}$ cm$^{-3}$ at the interface to layer 303AB, with the total thickness of layer 303AC being 100 nm. GaAs layer 303AB was grown on top of layer 303AC. GaAs layer 303AB was doped p-type with zinc to a doping density of $1\times10^{18}$ cm$^{-3}$ and grown to a thickness of 100 nm. GaAs layer 303AA was grown on top of layer 303AB. GaAs layer 303AA was doped p-type with zinc to a doping density varied linearly from 5E19/cc at the interface to layer 303AB to $1\times10^{20}$ cm$^{-3}$ at the top surface, with the total thickness of layer 303AC being 100 nm.

Figure 8B:
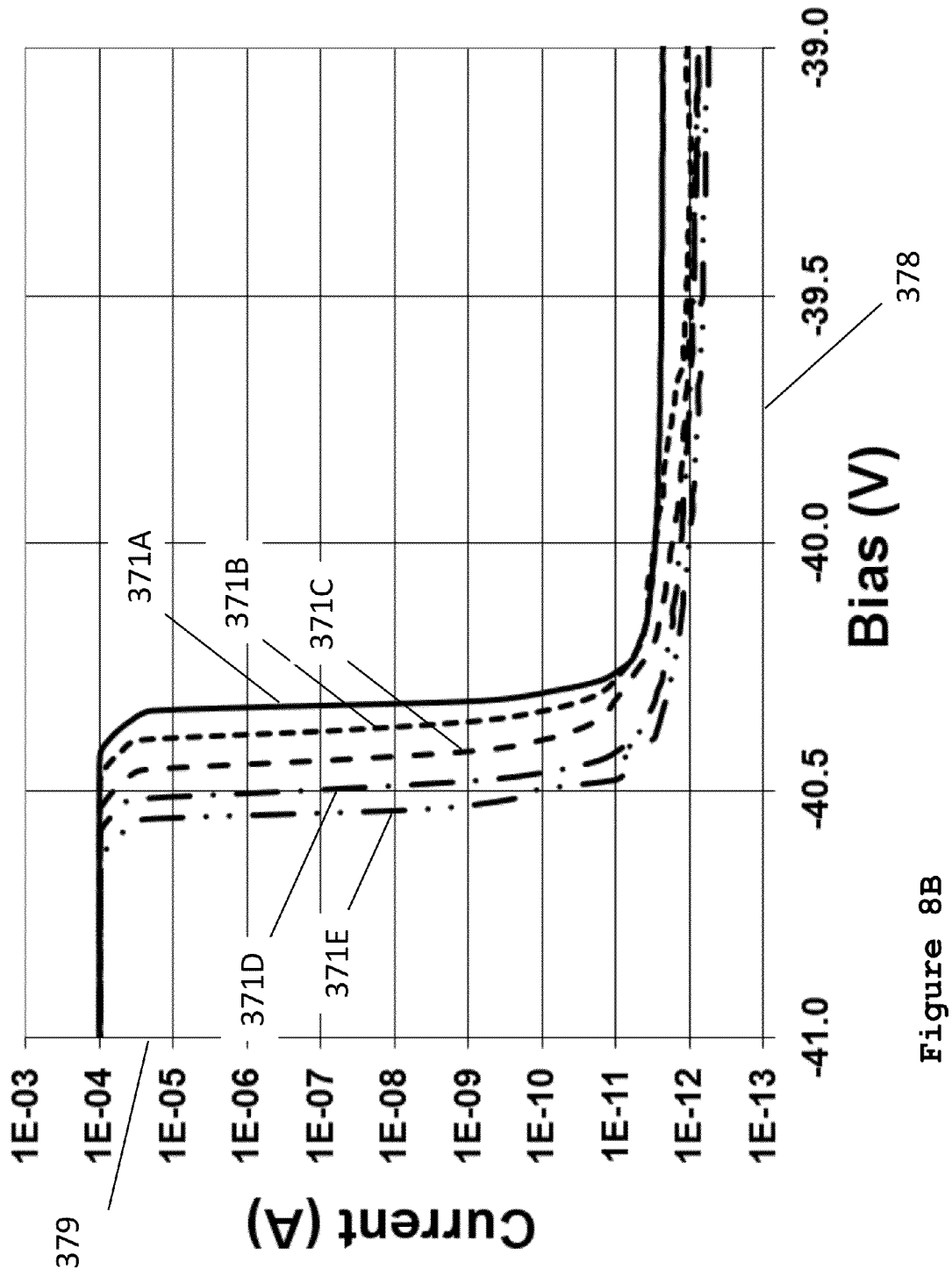
FIG. 8B show experimental current-voltage (I-V) curves as a function of temperature for diodes fabricated from the epitaxial layer structure shown in FIG. 8A.

Reference is now made to FIG. 8B, showing experimental data of the avalanche of the diode current-voltage curves from GaAs diodes fabricated from the layer structure shown in FIG. 8A. Beveled edge mesa termination and sulfur passivation was used to minimize edge effects. Axis 389 shows the diode current on a logarithmic scale running from 100 pA to 1 mA. Axis 378 shows the applied voltage bias on a linear scale running from a bais of −41.0 V to −39.0 V, where the negative sign denotes a reverse bias. Curve 371A shows the diode current when the temperature of the diode is about 14.8° C. (as measured by a thermocouple attached to the wafer probe chuck, with the diode wafer being placed on top of the wafer probe chuck). Curve 371B shows the diode current when the temperature of the diode is about 15.8° C. Curve 371C shows the diode current when the temperature of the diode is about 17.5° C. Curve 371D shows the diode current when the temperature of the diode is about 18.4° C. Curve 371E shows the diode current when the temperature of the diode is about 19.6° C. Analysis of these curves shows a temperature sensitivity of the avalanche breakdown edge of about −45 mV/° C. in excellent agreement with the theoretical analysis.

It is important to recognize that the avalanche transition edge can be placed anywhere within a very broad range of operating temperatures. The paper (F. Ma, G. Karve, X. Zheng, X. Sun, A. L. Holmes Jr., and J. C. Campbell, "Low-temperature breakdown properties of $Al_xGa_{1-x}As$ avalanche photodiodes," Appl. Phys. Lett. 81(10) pp. 1908-1910 (2002)) shows an almost linear change in the breakdown field strength in GaAs, changing from about 22 V/μm at 50K to about 32 V/μm at 300 K. This means that a PIN device with a 1.25 μm thick depletion region will exhibit a breakdown voltage shift from 40 V at 300 K to 27.5 V at 50 K, corresponding to a temperature coefficient of 50 mV/K.

The temperature dependence of the avalanche multiplication transition edge is determined, in part, by the temperature dependence of the impact ionization coefficients, the temperature dependence of the band gap, and the temperature dependence of inelastic scattering. As mentioned above, the sharpness of the avalanche multiplication transition edge is determined in part by the impact ionization coefficients and by the feedback between the electron and hole ionization events. Note that all of these parameters can be adjusted at design time through optimization of semiconductor materials, doping, heterojunctions, etc. See Campbell et al., "Avalanche Photodiodes with an Impact-Ionization-Engineered Multiplication Region," U.S. Pat. No. 7,045,883 (May 16, 2006) for examples.

Reference is now made to FIG. 9, which show how an alternative embodiment of the invention can be fabricated on a silicon-on-insulator substrate. Reference is now made particularly to FIGS. 9A and 9B. FIG. 9A shows a three-dimensional side view of the silicon-on-insulator (SOI) substrate prior to processing. Layer 401 is a p-type silicon layer with a thickness 451. Layer 403 is the insulator layer, consisting of silicon dioxide ($SiO_2$) with a thickness 453. Layer 405 is the underlying silicon support wafer, consisting a silicon wafer of thickness 455. FIG. 9B shows a top view of the same SOI wafer. From this top view, only the p-type silicon layer 401 is visible.

Figure 9B:
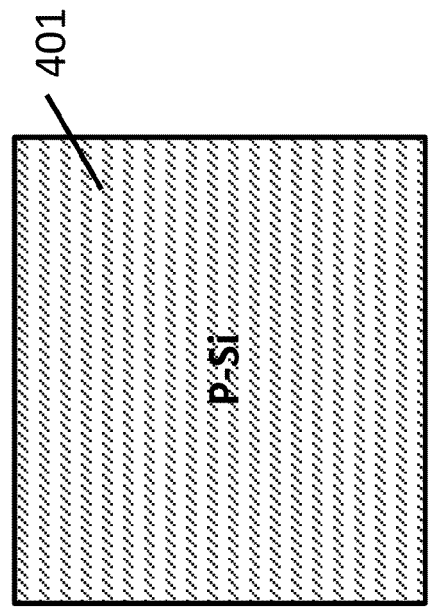
FIG. 9 show how a thermally isolated, lateral PN diode structure, including an structure for absorbing incident electromagnetic radiation can be fabricated using a silicon-on-insulator substrate.
Figure 9A:
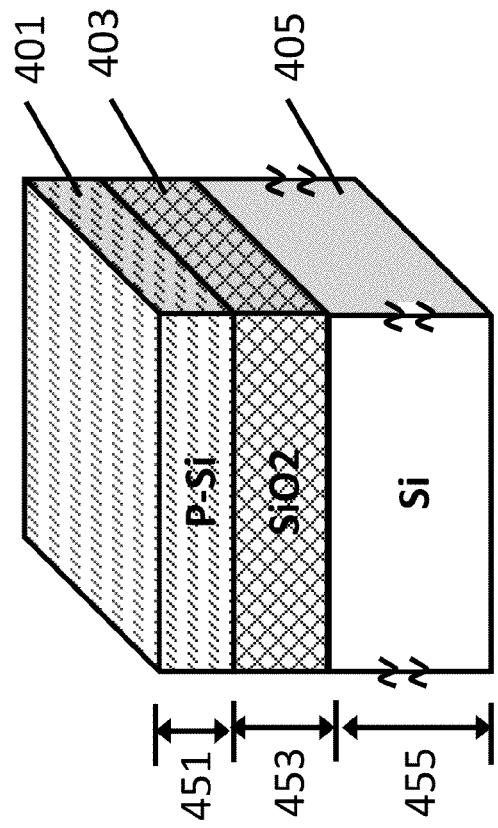
Figure 9D:
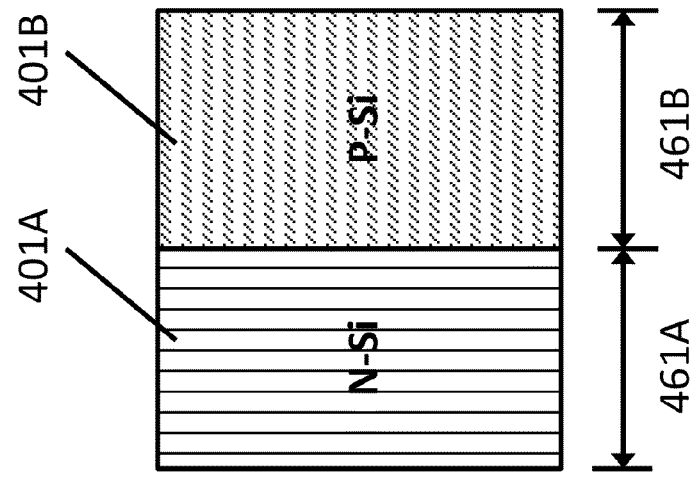
Figure 9C:
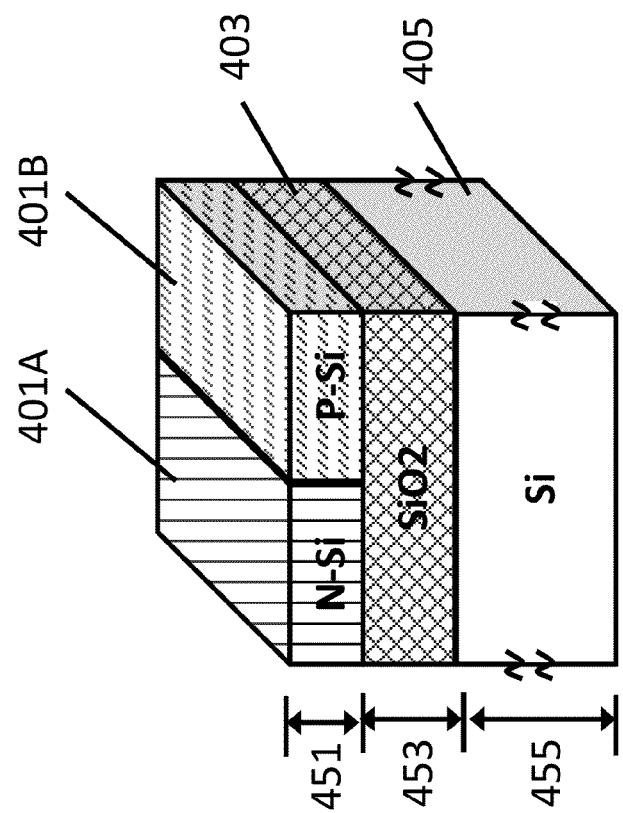

Reference is now made to FIGS. 9C and 9D. FIG. 9C shows a three-dimensional side view of the silicon-on-insulator (SOI) substrate after a first step of processing, whereby a portion of layer 401 has been converted to n-type silicon, as can be achieved by masking, ion implantation, and annealing. Layer 401A is the portion of layer 401 that has been converted to n-type silicon, while layer 401B is the portion of layer 401 that remains p-type silicon. FIG. 9D shows a top view of the partially processed SOI wafer from FIG. 9C. From this top view, only the n-type silicon region 401A and the p-type silicon region 401B is visible. The width of layer 401A is denoted 461A and the width of layer 401B is denoted 461B.

Figure 9F:
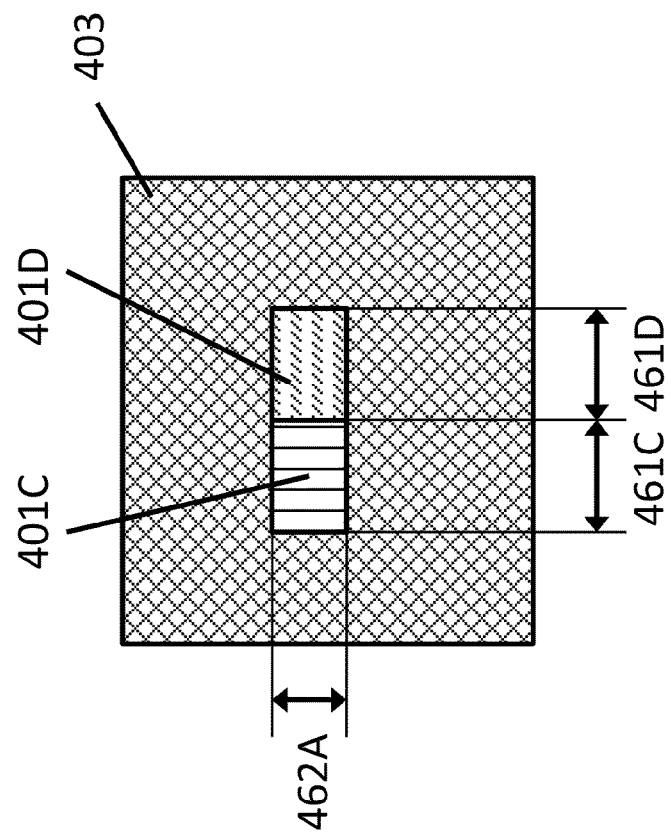
Figure 9E:
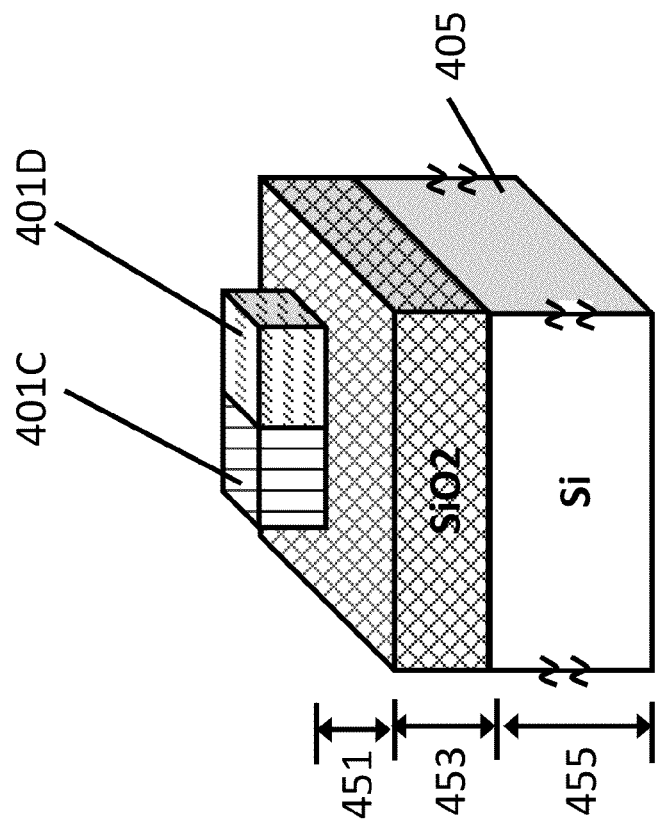

Reference is now made to FIGS. 9E and 9F. FIG. 9E shows a three-dimensional side view of the silicon-on-insulator (SOI) substrate after a second step of processing, whereby masking and selective etching has been used to define the lateral extents of layers 401A and 401B. Selective etching has been used to selectively remove the portions of layers 401A and 401B that lie outside regions 401C and 401D. Region 401C is the portion of layer 401A that remains after etching. Region 401D is the portion of layer 401B that remains after etching. FIG. 9F shows a top view of the partially processed SOI wafer from FIG. 9D. Dimensions 461C and 462A define the lateral dimensions of region 401C. Dimensions 461D and 462A define the lateral dimensions of region 401D.

Figure 9H:
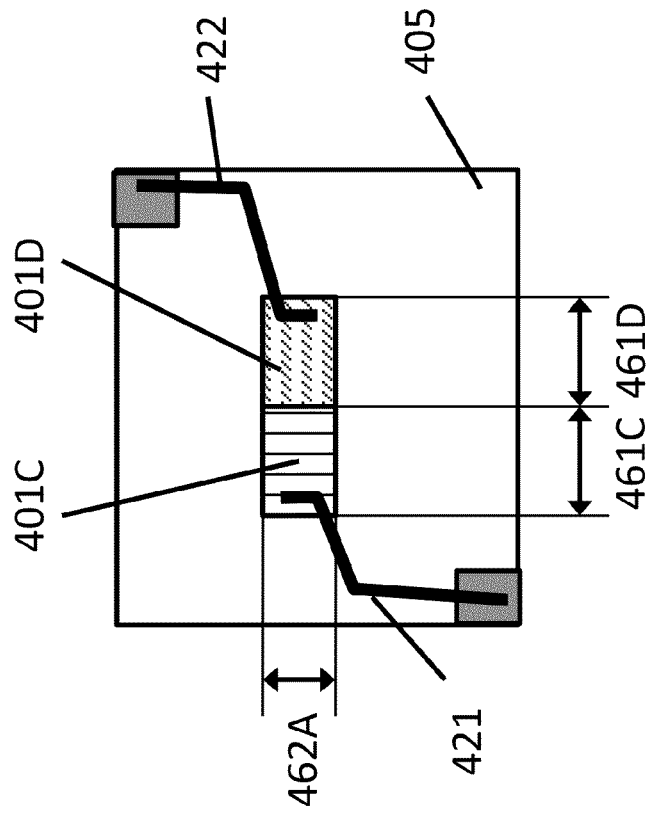
Figure 9G:
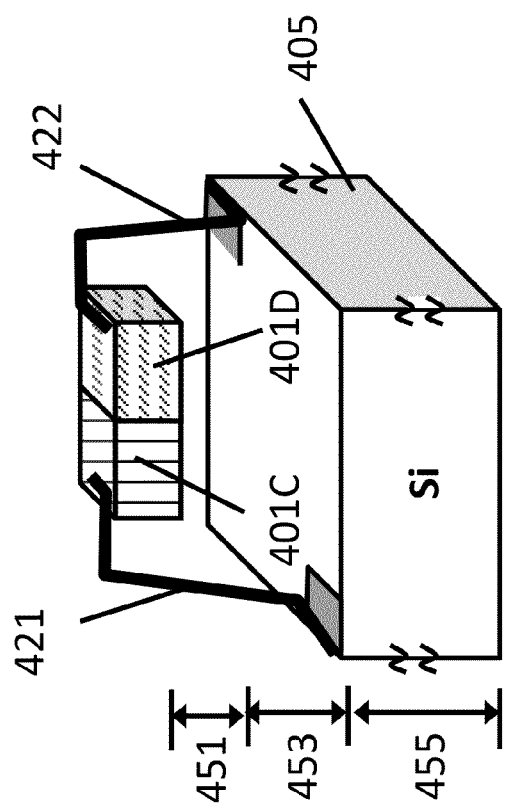

Reference is now made to FIGS. 9G and 9H. FIG. 9G shows a three-dimensional side view of the silicon-on-insulator (SOI) substrate after a third step of processing, whereby supports and contacts 421 and 422 have been added. Support 421 provides both mechanical support to connect 401C and 401D to substrate 405 and electrical contact to region 401C. Support 422 provides both mechanical support to connect 401C and 401D to substrate 405 and electrical contact to region 401D. Selective etching has been used to remove the $SiO_2$ layer 403, separating regions 401C and 401D from the substrate. Low thermal conductivity can be achieved if supports 421 and 422 exhibit low thermal conductivity, and thermal isolation is improved by operation in a vacuum.

Figure 9J:
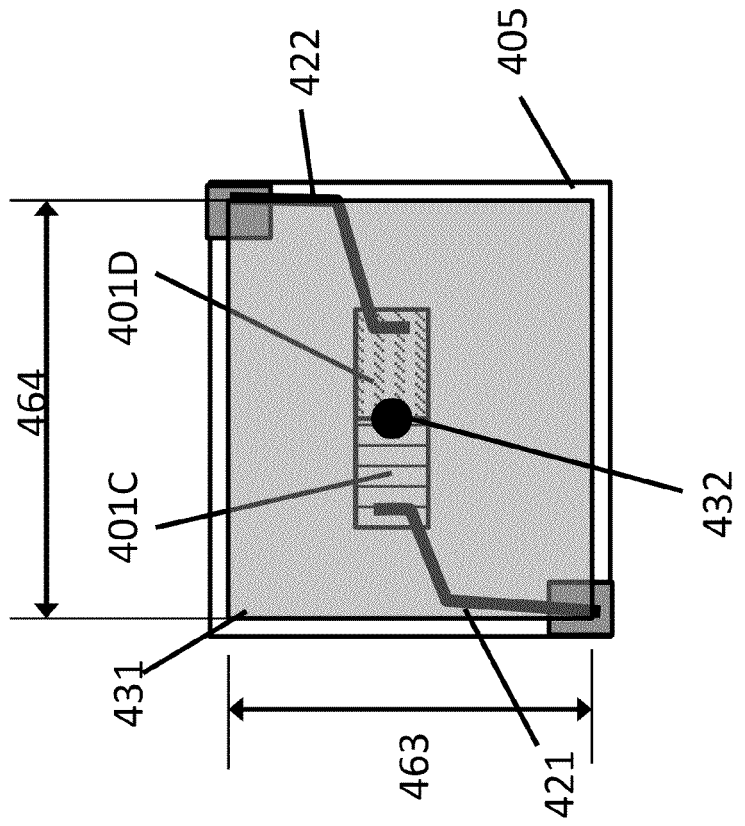
Figure 9I:
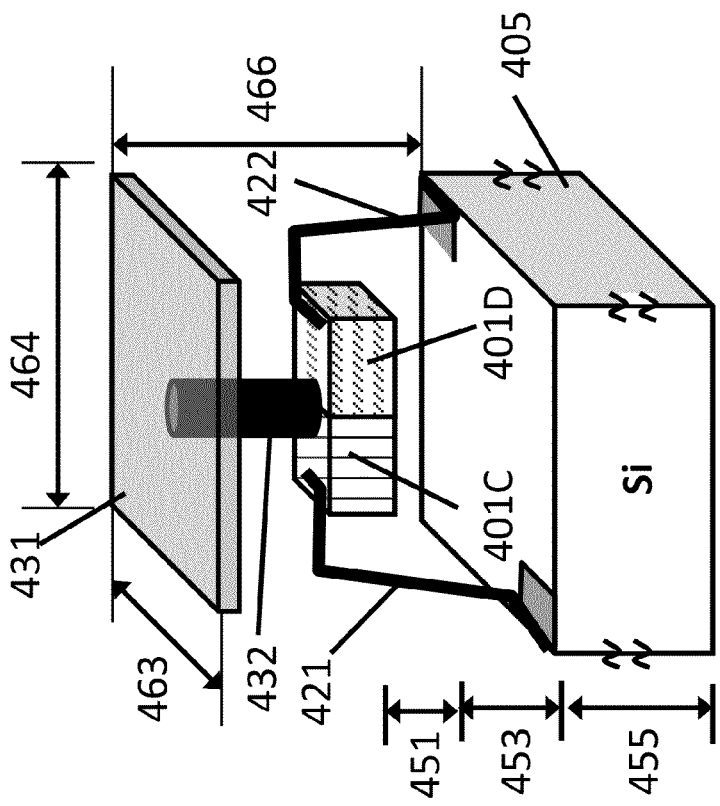

Reference is now made to FIGS. 9I and 9J. FIG. 9I shows a three-dimensional side view of the silicon-on-insulator (SOI) substrate after a forth step of processing, whereby absorber 431 thermal interconnect 432 have been added to provide a means of absorbing incident electromagnetic radiation. Absorber 431 has lateral dimensions 463 and 464, and has a vertical separation 466 from substrate 405. Absorber 431 typically incorporates a thin metallic layer of TiN, NiCr, Ti, Mb, and their oxides. FIG. 9J show a top view after this forth step of processing.

Reference is now made to FIGS. 9K and 9L, which show an alternative configuration where the thin metallic absorber layer 431 is replaced by a dielectric layer 431A, and an antenna 411 is used to capture the incident electromagnetic power. Antenna 411 converts the incident electromagnetic power into an electrical current, which drives a resistive load, resulting in a source of thermal power coupled to the microbolometer through thermal connection 432B. This structure is often called an antenna-coupled microbolometer.

The applicants intend to seek, and ultimately receive, claims to all aspects, features and applications of the current invention, both through the present application and through continuing applications, as permitted by 35 U.S.C. §120, etc. Accordingly, no inference should be drawn that applicants have surrendered, or intend to surrender, any potentially patentable subject matter disclosed in this application, but not presently claimed. In this regard, potential infringers should specifically understand that applicants may have one or more additional applications pending, that such additional applications may contain similar, different, narrower or broader claims, and that one or more of such additional applications may be designated as not for publication prior to grant.

We claim the following:

1. An array of at least two microbolometer pixels for imaging incident infrared wavelengths including at each pixel:
   a. A thermal absorber which absorbs said incident infrared wavelengths and converts the power of said incident infrared wavelengths into thermal energy,
   b. An avalanche breakdown transition edge diode in thermal contact with said thermal absorber, and
   c. A thermal link between said avalanche breakdown transition edge diode and a substrate,
wherein said avalanche breakdown transition edge diode is configured to operate in an electrothermal feedback loop to stabilize the temperature of said avalanche breakdown transition edge diode.

2. The array of claim 1 wherein the changes in the power of said incident infrared wavelengths is determined by holding the voltage bias of said avalanche breakdown transition edge diode constant and monitoring the corresponding change in current of said avalanche breakdown transition edge diode.

3. The array of claim 1 wherein the changes in the power of said infrared wavelengths is determined by holding the current of said avalanche breakdown transition edge avalanche diode constant and monitoring the corresponding change in voltage of said avalanche breakdown transition edge diode.

4. The array of claim 1 wherein the changes in the power of said incident infrared wavelengths is determined by modulating the voltage bias of said avalanche breakdown transition edge diode and measuring the corresponding changes in the modulated current through said avalanche breakdown transition edge diode.

5. The array of claim 1 where the thermal conductivity of said thermal link is less than 1000 nW per K.

6. The array of claim 1 where the avalanche breakdown transition edge diode is a semiconductor diode configured to operate in the regime of the avalanche breakdown.

7. The array of claim 6 wherein said semiconductor diode is formed using a semiconductor with at least 10% silicon atoms.

8. The array of claim 7 wherein said semiconductor diode is formed using a semiconductor with at least 90% silicon atoms.

9. An array of at least two microbolometer pixels for imaging incident infrared wavelengths including at each pixel:
   a. A thermal absorber which absorbs said incident infrared wavelengths and converts the power of said infrared wavelengths into thermal energy,
   b. A avalanche breakdown transition edge diode,
   c. A thermal mass in thermal contact with said thermal absorber and said avalanche breakdown transition edge diode, and
   d. A thermal link between said thermal mass and said substrate,
wherein said avalanche breakdown transition edge diode is configured to operate in an electrothermal feedback loop to stabilize the temperature of said thermal mass.

10. The array of claim 9 wherein the changes in the power of said incident infrared wavelengths is determined by holding the voltage bias of said avalanche breakdown transition edge diode constant and monitoring the corresponding change in current of said avalanche breakdown transition edge diode.

11. The array of claim 9 wherein the changes in the power of said infrared wavelengths is determined by holding the current of said avalanche breakdown transition edge avalanche diode constant and monitoring the corresponding change in voltage of said avalanche breakdown transition edge diode.

12. The array of claim 9 wherein the changes in the power of said incident infrared wavelengths is determined by modulating the voltage bias of said avalanche breakdown transition edge diode and measuring the corresponding changes in the modulated current through said avalanche breakdown transition edge diode.

13. The array of claim 9 where the thermal conductivity of said thermal link is less than 1000 nW per K.

14. The array of claim 9 where the avalanche breakdown transition edge diode is a semiconductor diode configured to operate in the regime of the avalanche breakdown.

15. The array of claim 14 wherein said semiconductor diode is formed using a semiconductor with at least 10% silicon atoms.

16. The array of claim 15 wherein said semiconductor diode is formed using a semiconductor with at least 90% silicon atoms.

17. An array of microbolometer pixels for imaging incident infrared wavelengths including at each pixel:
   a. A thermal absorber which absorbs said incident infrared wavelengths and converts the power of said infrared wavelengths into thermal energy,
   b. A pixel avalanche breakdown transition edge diode,
   c. A pixel thermal mass in thermal contact with said thermal absorber and said avalanche breakdown transition edge diode, and
   d. A pixel thermal link between said thermal mass and said substrate, Wherein said microbolometer array further includes additional reference avalanche breakdown transition edge diodes connected to a reference thermal mass, with said reference thermal mass being connected with a reference thermal link to said substrate. The reference avalanche breakdown transition edge diodes are configured to operate in a reference electrothermal feedback loop.

18. The array of claim 17 wherein said reference thermal link to said substrate is a thermal short and the reference electrothermal feedback loop is used to maintain the reference thermal mass at the same temperature as said substrate.

19. The array of claim 18 wherein at least one of said pixel avalanche transition diodes are biased to the same voltage of one of said reference avalanche breakdown transition edge diodes.

20. The array of claim 18 wherein at least one of said pixel avalanche transition edge diodes are biased with a constant offset voltage relative to the voltage of one of said reference avalanche breakdown transition edge diodes.

21. The array of claim 17 wherein the reference thermal link to said substrate exhibits a thermal conductivity less than 1000 nW/K, and the electrothermal feedback loop is used to maintain a temperature offset between said reference thermal mass and said substrate.

22. The array of claim 21 wherein the temperature offset between said reference thermal mass and said substrate can be estimated by the product of the power dissipated in said reference avalanche breakdown transition edge diode and the thermal conductivity of said reference thermal link.

23. The array of claim 21 wherein at least one of said pixel avalanche transition diodes are biased to the same voltage of one of said reference avalanche breakdown transition edge diodes.

24. The array of claim 21 wherein at least one of said pixel avalanche transition edge diodes are biased with a constant offset voltage relative to the voltage of one of said reference avalanche breakdown transition edge diodes.

25. An array of microbolometer pixels for imaging incident infrared wavelengths including at each pixel:
   a. An antenna which absorbs said incident infrared wavelengths and coverts the power of said infrared wavelengths to thermal power dissipated in a load impedance,
   b. An avalanche breakdown transition edge diode in thermal contact with said load impedance,
   c. A thermal link between said avalanche breakdown transition edge diode and a substrate Wherein said transition edge diode is configured to operate in an electrothermal feedback loop to stabilize the temperature of said avalanche transition edge diode and said load impedance.

26. The array of claim 25 wherein said thermal link exhibits a thermal conductivity less than 1000 nW/K.

27. The array of claim 25 wherein said avalanche transition edge diode is a semiconductor diode configured to operate in the region of avalanche breakdown.

28. The array of claim 27 wherein said semiconductor diode consists of at least 10% silicon atoms.

29. The array of claim 28 wherein said semiconductor diode consists of at least 90% silicon atoms.

* * * * *